United States Patent [19]
Ichikawa et al.

[11] Patent Number: 6,078,368
[45] Date of Patent: Jun. 20, 2000

[54] ACTIVE MATRIX SUBSTRATE, LIQUID CRYSTAL APPARATUS USING THE SAME AND DISPLAY APPARATUS USING SUCH LIQUID CRYSTAL APPARATUS

[75] Inventors: Takeshi Ichikawa, Hachioji; Mamoru Miyawaki, Isehara; Katsumi Kurematsu, Hiratsuka; Osamu Koyama, Hachioji, all of Japan

[73] Assignee: Canon Kabushiki Kaisha, Tokyo, Japan

[21] Appl. No.: 09/350,935

[22] Filed: Jul. 12, 1999

Related U.S. Application Data

[62] Division of application No. 08/953,401, Oct. 17, 1997.

[30] Foreign Application Priority Data

| Oct. 18, 1996 | [JP] | Japan | 8-276529 |
| Oct. 9, 1997 | [JP] | Japan | 9-277474 |

[51] Int. Cl.⁷ .............................. G02F 1/136; H01L 29/04
[52] U.S. Cl. .................................. 349/48; 349/42; 257/59; 257/72
[58] Field of Search .......................... 349/42, 48; 257/59, 257/72

[56] References Cited

U.S. PATENT DOCUMENTS

| 4,981,340 | 1/1991 | Kurematsu et al. | 350/333 |
| 5,161,042 | 11/1992 | Hamada | 359/41 |
| 5,218,232 | 6/1993 | Yuzurihara et al. | 257/754 |
| 5,251,050 | 10/1993 | Kurematsu et al. | 359/57 |
| 5,351,145 | 9/1994 | Miyata et al. | 349/48 |
| 5,412,240 | 5/1995 | Inoue et al. | 257/347 |
| 5,434,441 | 7/1995 | Inoue et al. | 257/347 |
| 5,500,538 | 3/1996 | Yamazaki et al. | 257/49 |
| 5,543,947 | 8/1996 | Mase et al. | 359/84 |
| 5,606,340 | 2/1997 | Suzuki et al. | 349/42 |
| 5,644,373 | 7/1997 | Furushima et al. | 349/158 |
| 5,650,636 | 7/1997 | Takemura et al. | 349/42 |
| 5,654,914 | 8/1997 | Nii et al. | 365/154 |
| 5,668,650 | 9/1997 | Mori et al. | 349/42 |
| 5,706,021 | 1/1998 | Kurematsu | 345/89 |
| 5,708,485 | 1/1998 | Sato et al. | 349/42 |
| 5,717,473 | 2/1998 | Miyawaki | 349/43 |
| 5,736,462 | 4/1998 | Takahashi et al. | 438/692 |
| 5,757,054 | 5/1998 | Miyawaki et al. | 349/42 |
| 5,812,231 | 9/1998 | Kochi et al. | 349/151 |
| 5,908,315 | 6/1999 | Gardner et al. | 438/305 |
| 5,917,224 | 6/1999 | Zanagara | 257/390 |

FOREIGN PATENT DOCUMENTS

| 0495428 | 7/1992 | European Pat. Off. |
| 0689086 | 12/1995 | European Pat. Off. |
| 59-133590 | 7/1984 | Japan . |
| 363311740 | 12/1988 | Japan . |
| 2050668 | 1/1981 | United Kingdom . |

OTHER PUBLICATIONS

S.M. Fluxman, "Integrated Active Matrix Liquid Crystal Displays", The GEC Journal of Research 11 (1993) No. 1, Chelmsford, Essex, G.B.

Asada et al., "A 2.7 in. 1.3M Pixel Driver–Integrated Poly–si TFT–LCD for Multimedia Projectors", IEEE International Solid State Circuits Conference, vol. 39, Feb. 1996, p. 190/191.

Rycke et al., "2–MHz Clocked LCD Drivers On Glass", IEEE Journal of Solid–State Circuits, 25 (1990) Apr., No. 2, New York, U.S., pp. 531–538.

*Primary Examiner*—William L. Sikes
*Assistant Examiner*—Tarifur R. Chowdhury
*Attorney, Agent, or Firm*—Fitzpatrick, Cella, Harper & Scinto

[57] ABSTRACT

A liquid crystal apparatus comprises an active matrix substrate including a plurality of scanning lines and a plurality of signal lines, transistors arranged respectively at the crossings of the scanning lines and the signal lines and having the source region connected to the corresponding signal line and the gate region connected to the corresponding scanning line and pixel electrodes connected respectively to the drain regions of the transistors, an opposite substrate disposed oppositely relative to the active matrix substrate and a liquid crystal material filled in the space between the active matrix substrate and the opposite substrate. A source region is shared by each pair of adjacently located transistors and connected to the corresponding signal line.

3 Claims, 26 Drawing Sheets

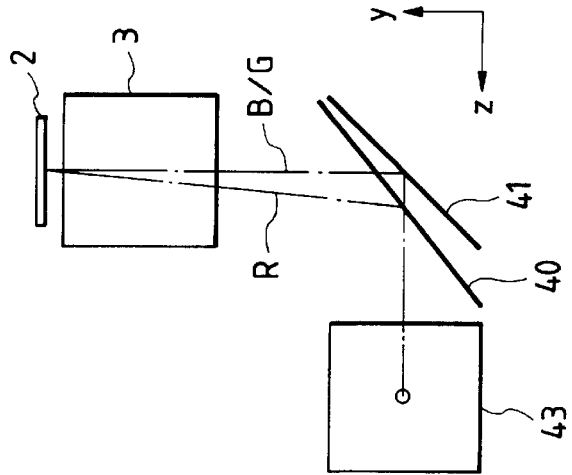
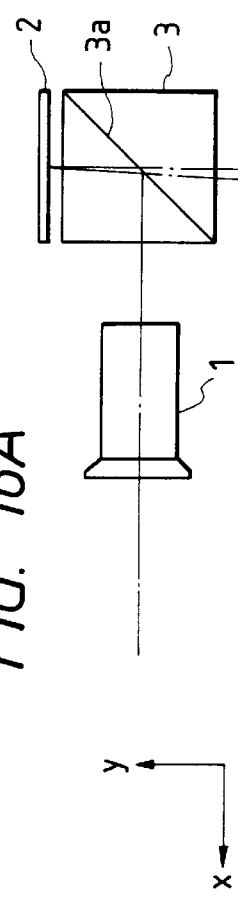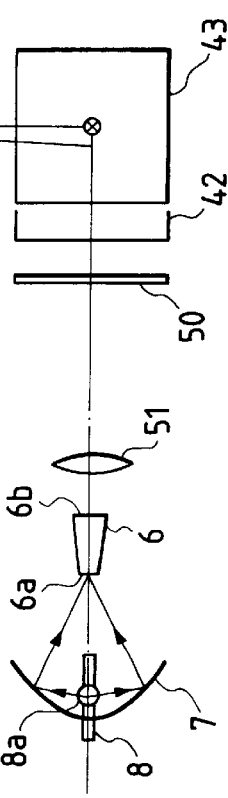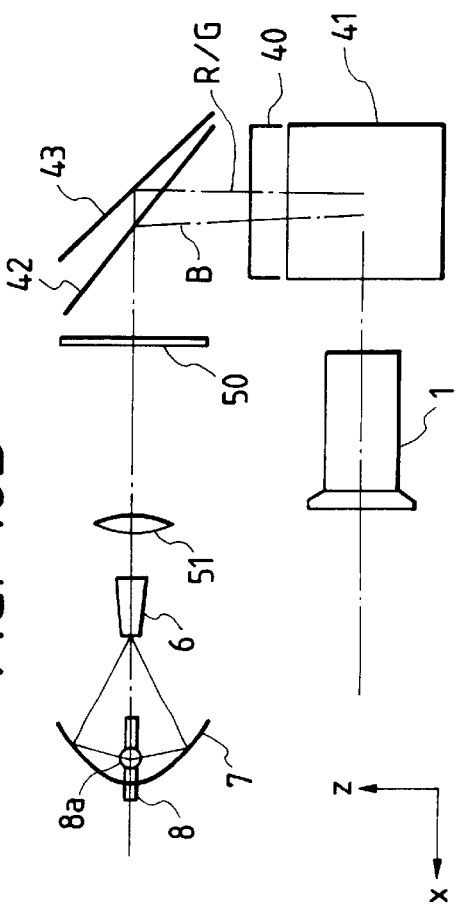

ORIGINAL COLOR (R/G/B MIXED)

ACTIVE MATRIX SUBSTRATE, LIQUID CRYSTAL APPARATUS USING THE SAME AND DISPLAY APPARATUS USING SUCH LIQUID CRYSTAL APPARATUS

This application is a division of U.S. application Ser. No. 08/953,401, filed Oct. 17, 1997.

BACKGROUND OF THE INVENTION

1. Field of the Invention

This invention relates to an active matrix substrate and to a liquid crystal apparatus comprising such an active matrix substrate and liquid crystal for displaying pictures and characters as well as to a display apparatus comprising such a liquid crystal apparatus.

2. Related Background Art

The current world has entered a so-called multi-media age and devices and equipment for exchanging pictorial data for communication purposes are playing an ever-increasingly important role in the world. In this tide, liquid crystal apparatus are attracting attention because they can be realized in a thin and portable form and consume power only at a reduced rate so that the industry of manufacturing such devices has grown as one of the major industries that is comparable with the semiconductor industry.

Liquid crystal apparatus are at present popularly used for so-called notebook size personal computers having a size as short as ten inches. Additionally, liquid crystal is expected to play a major role in displays of electronic work stations and home television sets that typically comprise a large display screen. However, a large display screen involves high manufacturing cost and is required to meet rigorous electric requirements for driving such a large screen. As a rule of thumb, the manufacturing cost of a liquid crystal display panel is said to be proportional to the square or cube of the size of the screen.

Thus, as an alternative, a projection system designed to use a small liquid crystal panel and enlarge the image formed on it has been proposed. Such a system is made feasible mainly due to the recent development of finely sized semiconductor devices that operate excellently and can be manufactured at low cost.

In view of the recent technological development, there is an increasing demand for small TFTs provided with a satisfactory drive power to be used in liquid crystal display panels comprising TFTs. Additionally, TFTs using polycrystalline Si rather than amorphous Si are getting popularity. Video signals for the level of resolution meeting the NTSC standards that are used for the NTSC television system do not require high speed processing capabilities. Therefore, not only TFTs but also components of peripheral circuits including shift registers and decoders may be made of polycrystalline Si to produce a liquid crystal display apparatus wherein a display region and peripheral drive circuits are integrally formed.

However, polycrystalline Si is less performing than monocrystalline Si so that shift registers, for example, may have to be divided into a plurality of groups that are installed separately in order to realize a television set with a level of resolution higher than the level required by the NTSC standards or a computer display with the so-called XGA or SXGA class of resolution. Then, noise can appear as ghost along the boundaries of the separated devices in the display region to provide a problem to be solved.

In an attempt to bypass this problem, display apparatus comprising a monocrystalline Si substrate having a high drive potential have been proposed to replace display apparatus of the above described integral type using monocrystalline Si. Since the drive potential of the transistors of the peripheral drive circuits of such display apparatus is satisfactory, the above described technique of dividing devices is not necessary here and hence the noise problem can be successfully avoided.

However, it has been a tough challenge for known liquid crystal display apparatus to reduce the pixel size because the drive voltage of the liquid crystal is relatively high and hence the transistors have to show a correspondingly high withstand voltage. Additionally, there arises another problem of the difficulty of reducing the time constant of the signal lines because of an increase in the capacitance and the resistance of the signal lines if the lines and the wiring space of the apparatus are reduced, a problem that makes it difficult to realize a liquid crystal display apparatus comprising down-sized chips. Still additionally, there is another problem that a liquid crystal display apparatus normally show a large video line capacitance and requires a large drive potential for the external drive system, which is a problem that also baffles efforts for high speed operation and low manufacturing cost.

SUMMARY OF THE INVENTION

In view of the above described circumstances, it is therefore an object of the present invention to provide a liquid crystal display apparatus having a reduced pixel size and a reduced signal line capacitance. Such a display apparatus can display finely defined images with down-sized chips.

Another object of the invention is to provide a liquid crystal display apparatus having a reduced video line capacitance and requiring less drive potential for the external drive system to realize high speed operation and low manufacturing cost.

Still another object of the present invention is to provide an active matrix substrate comprising a plurality of scanning lines and a plurality of signal lines, transistors arranged respectively at the crossings of the scanning lines and the signal lines and having the source region connected to the corresponding signal line and the gate region connected to the corresponding scanning line and pixel electrodes connected respectively to the drain regions of the transistors, characterized in that a source region is shared by each pair of adjacently located transistors and connected to the corresponding signal line.

A further object of the present invention is to provide a liquid crystal apparatus comprising an active matrix substrate including a plurality of scanning lines and a plurality of signal lines, transistors arranged respectively at the crossings of the scanning lines and the signal lines and having the source region connected to the corresponding signal line and the gate region connected to the corresponding scanning line and pixel electrodes connected respectively to the drain regions of the transistors, an opposite substrate disposed oppositely relative to the active matrix substrate and a liquid crystal material filled in the space between the active matrix substrate and the opposite substrate, characterized in that a source region is shared by each pair of adjacently located transistors and connected to the corresponding signal line.

The present invention provides the following advantages. An enhanced degree of integration can be realized to downsize the liquid crystal display apparatus by making each pair of adjacently located pixel switch transistors of the apparatus share a common source region and a common source electrode or a common drain region and a common drain electrode.

A further enhanced degree of integration of MOS transistors can be achieved by arranging pixels having only NMOSs under the pixel electrode and those having only PMOSs under the pixel electrode without arranging pixel switches of CMOS configuration under each and every pixel electrode because the need of providing regions for isolating different wells that are required when MOSs with different polarities are arranged adjacently is eliminated. As a result, the pixels can be dimensionally reduced to provide a display apparatus adapted to high definition at low cost due to the reduced sizes of chips.

The parasitic capacitance of the signal lines can be reduced. The capacitance of a signal line mainly consists of that of the wiring layer and the junction capacitance between the source electrode and the well connected thereto and the latter is defined as a function of the surface area of the source region. Thus, the capacitance of the source region can be remarkably reduced by the present invention.

Since the capacitance of the signal lines is reduced, the time required for transferring signals from the video lines to the signal lines is reduced to by turn realize a high speed drive operation.

The sizes of chips can be reduced further along with the parasitic capacitance of the video lines because the transfer switches for transferring video signals from the video lines to the signal lines can be down-sized by the present invention. Thus, the power required for the driver for applying video signals to the display panel can be saved to realize a high speed drive system at reduced cost.

Only a single $n^+$ region of nMOS is required for a pair of transistors as shown in FIG. 3. With this arrangement, the parasitic capacitance of the signal lines can be greatly reduced. More specifically, the parasitic source capacitance of the signal lines can be reduced by half by causing each pair of transistors to share a common source. Additionally, the length of the display apparatus can be reduced along the signal lines when each source is shared by a pair of transistors to by turn shorten the signal lines and consequently reduce the capacitance and the resistance of the signal lines. Thus, the signal writing characteristics of the signal lines can be greatly improved to realize a finely gradated signal writing operation. Still additionally, the manufacturing yield and the manufacturing efficiency can be remarkably improved to consequently lower the manufacturing cost of a display panel according to the invention.

The sampling switches can be down-sized as a combined effect of the improved signal writing characteristics and the reduced capacitance and resistance of the signal lines so that the capacitance of the video signal lines (video lines) connected to the source electrodes of the sampling switches for analog signals is reduced to by turn reduce the load of the peripheral circuits and the power consumption rate. The net result will be a display panel that operates excellently at low cost. The above pointed out advantages will become more remarkable and effective when the display panel comprises a greater number of pixels to achieve a higher degree of resolution.

The above described arrangement is applicable not only to TFTs but also to nMOS transistors and/or pMOS transistors that are directly formed on the substrate. When TFTs are used, the pixels can be dimensionally reduced if compared with the case where CMOS transistors are used for pixel switches so that consequently the capacitance and the resistance of the signal lines can be significantly reduced to realize a highly performing liquid crystal panel adapted to highly gradated signal writing operations. However, it should be noted that, unlike the case where CMOS transistors are used, a supply voltage higher than the write voltage may be required because the pixel switches are affected by the substrate bias so that the liquid crystal display panel may be suited for low voltage drive.

BRIEF DESCRIPTION OF THE DRAWINGS

FIGS. 16A, 16B and 16C are schematic illustrations showing a projection type display apparatus according to the invention.

DETAILED DESCRIPTION OF THE PREFERRED EMBODIMENTS

Now, the present invention will be described by referring to the accompanying drawings that illustrate preferred embodiment of the invention, although it should be noted that the present invention is not limited thereto by any means.

While the embodiments of liquid crystal panel according to the invention comprise a semiconductor substrate in the following description, some other substrate such as a transparent glass substrate may alternatively be used.

Additionally, while MOSFETs and TFTs are used as switching devices of liquid crystal panel in the following description, two terminal devices such as diodes may alternative be used.

Embodiments of liquid crystal panels as described hereinafter may find applications including home television sets, projectors, head mount displays, 3-D image video game machines, lap-top computers, electronic notebooks, teleconferencing systems, car navigation systems and instrument panels of airplanes.

[Embodiment 1]

Now, a first embodiment of the invention, or Embodiment 1, will be described by referring to FIG. 1. In this embodiment, CMOS transfer gate type switching devices are used for pixel switches.

Figure 1:
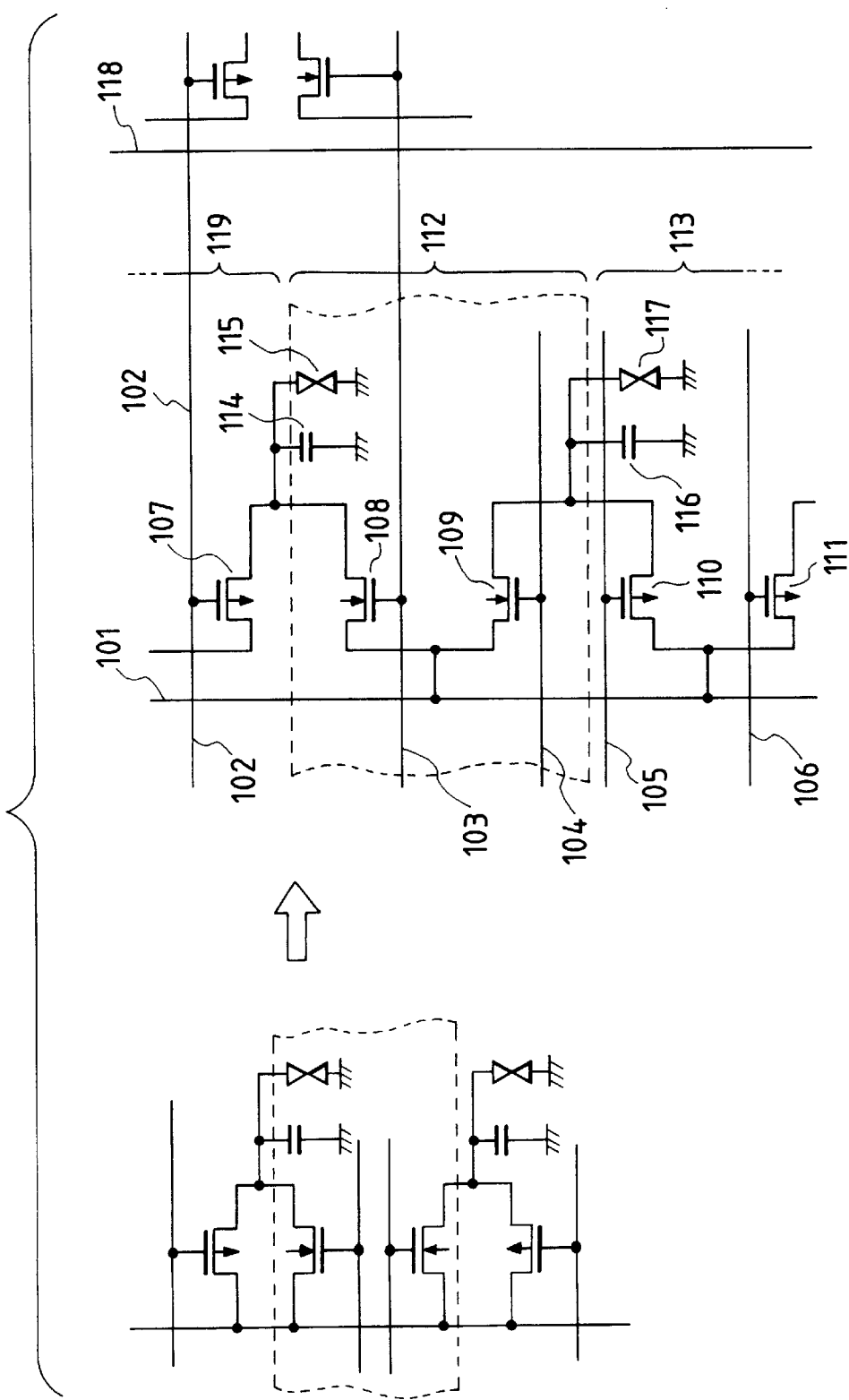
FIG. 1 is a schematic circuit diagram of a first embodiment of the invention, illustrating the underlying concept.

FIG. 1 is a schematic circuit diagram illustrating the concept of the invention, which is in fact an equivalent circuit for part of the pixel section of a liquid crystal display panel that can typically be used for a liquid crystal projector.

Referring to FIG. 1, there are shown signal lines 101 and 118, switching transistors 107 through 111 of the pixel section, liquid crystal elements 115 and 117, hold capacitances 114 and 116, drive lines (scanning lines) 102 through 106, a p-type region 112 and n-type regions 113 and 119. In this embodiment, a pixel switch is formed by combining a pMOS transistor 107 and an nMOS transistor 108.

FIGS. 2A through 2F are timing charts to be used for the circuit of FIG. 1.

Figure 2:
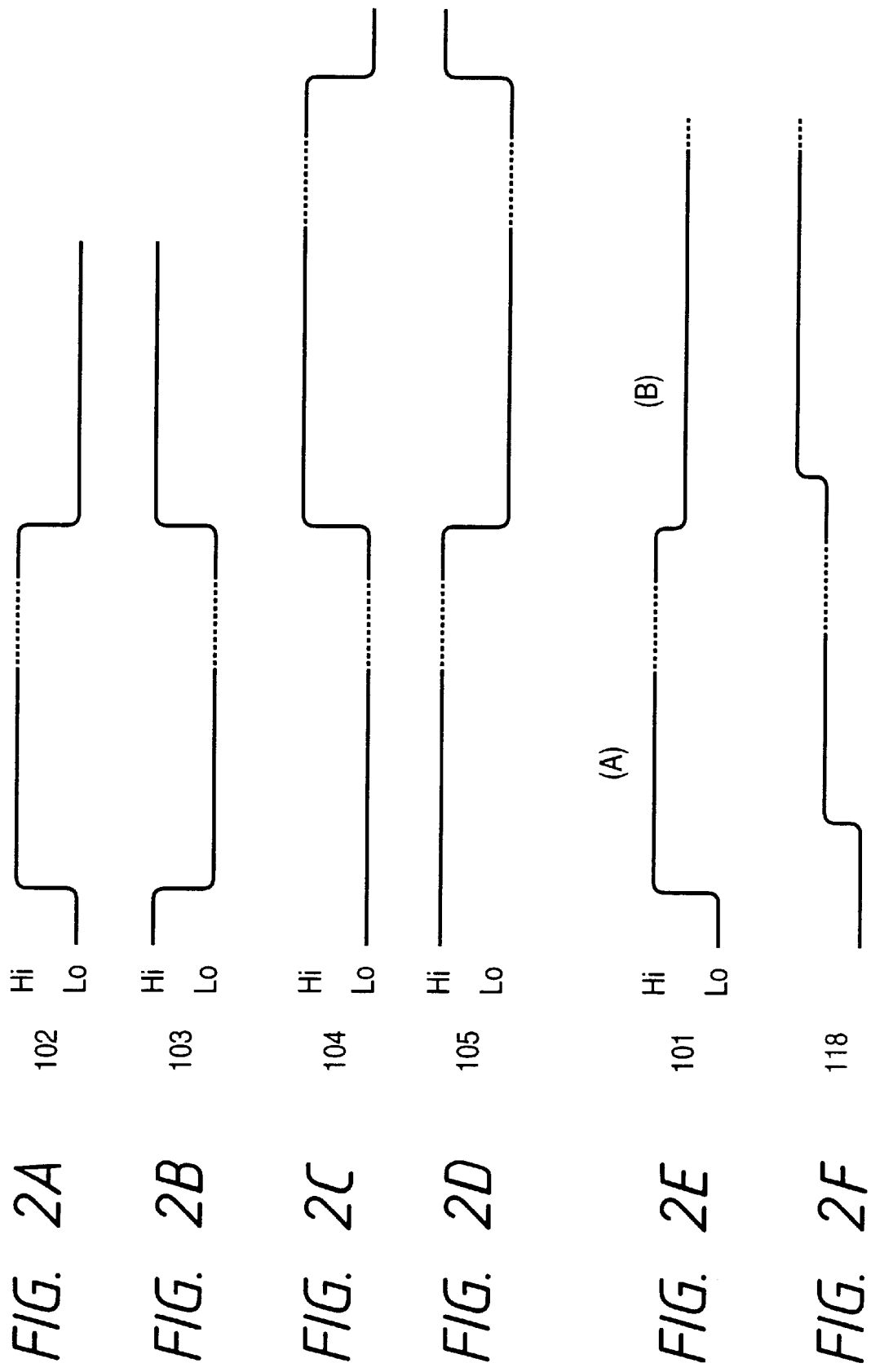
FIGS. 2A, 2B, 2C, 2D, 2E and 2F are timing charts to be used for the circuits of FIG. 1.

Referring to FIGS. 2A through 2F, firstly a signal for turning on the pixel switch transistors 107 and 108 is applied synchronously to the drive lines 102 and 103 (FIGS. 2A and 2B). Horizontal shift registers are sequentially driven to transfer the signal to the signal lines under this ON-state so that the electric potential of the signal line 101 is changed (FIG. 2E) to accumulate electric charges in the hold capacitance 114. Consequently, a voltage is applied to the liquid crystal element 115. Subsequently, the electric potential of the signal line 118 is changed (FIG. 2F) and the changing potential is written sequentially on the pixels. When the operation of writing the potential on the pixels of an entire line is over, the drive lines 102 and 103 are turned off and now a signal for turning on the pixel switch transistors 109 and 110 is applied to the drive lines 104 and 105 (FIGS. 2C and 2D). A similar cycle is repeated thereafter for each line until the changing potential is written on all the pixels of the panel. Then, the above described operational sequence is repeated further.

A characteristic aspect of this circuit configuration is that a pair of adjacently arranged pixel switch transistors such as transistors 108 and 109 share a common source electrode. The transistors 107 and 108 are ON when the potential A of the signal line 101 is being written if the transistors 108 and 109 share a common source electrode so that the potential A is written on the hold capacitance 114 but not on the hold capacitance 116 because the transistor 109 is OFF.

Figure 3:
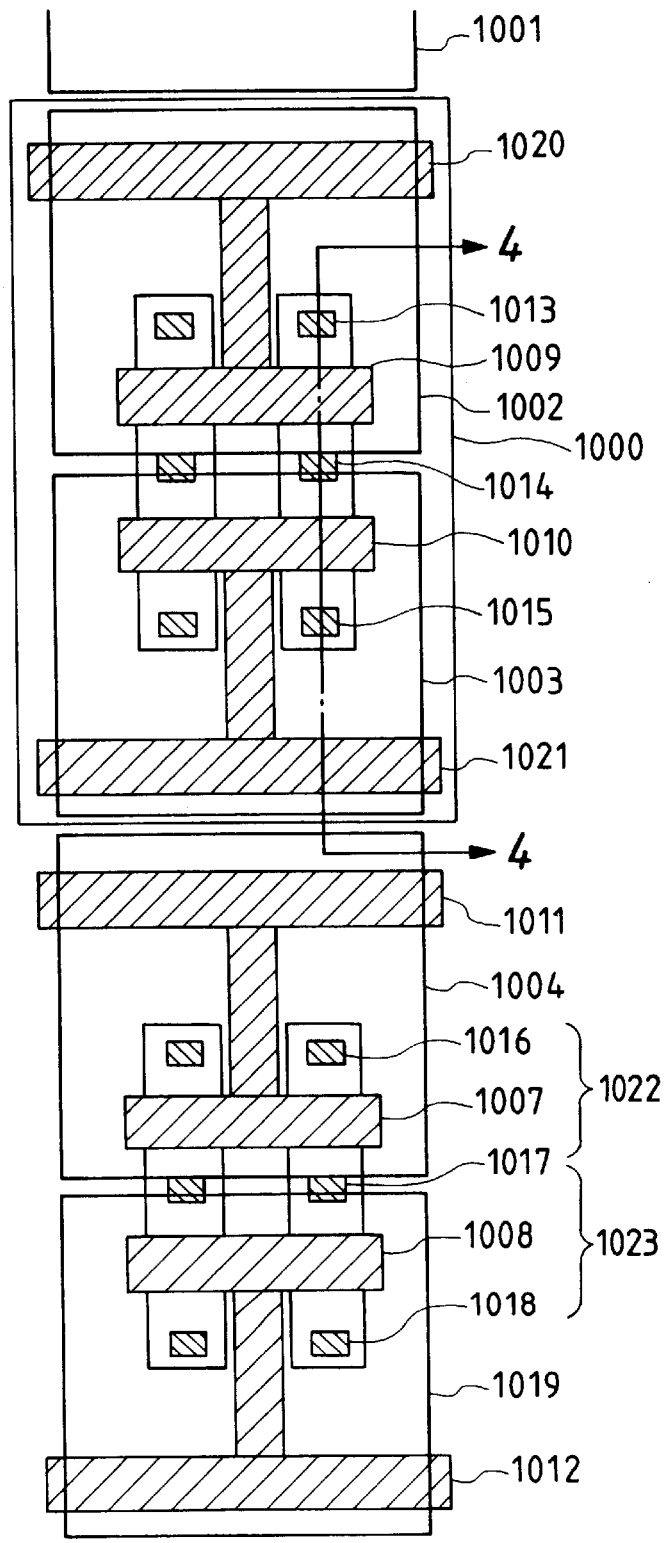
FIG. 3 is a schematic partial plan view of a first embodiment of liquid crystal apparatus according to the invention.
Figure 4:
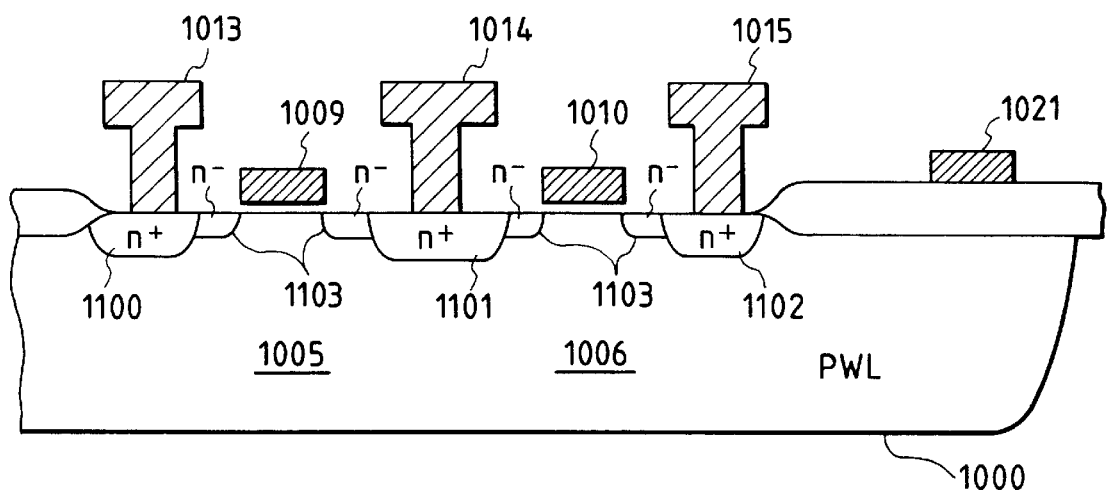
FIG. 4 is a cross sectional view of the embodiment of FIG. 3 taken along line 4—4.

FIG. 3 is a schematic plan view of a device of this embodiment and FIG. 4 is a cross sectional view taken along line 4—4 of FIG. 3.

Referring to FIGS. 3 and 4, reference numeral 1000 denotes a PWL region and NMOS transistors 1005 and 1006 are arranged within the PWL 1000. On the other hand, PMOS transistors 1022 and 1023 are arranged in an N-well or on an N-type substrate.

The gate electrode 1009 of the NMOS 1005 is connected to gate line 1020, while the drain electrode 1013 is connected to pixel electrode 1001 by way of a wiring layer (not shown). The source electrode 1014 is connected to a signal line formed by a wiring layer (not shown).

On the other hand, the gate electrode 1010 of the NMOS 1006 is connected to gate line 1021, while the drain electrode 1015 is connected to pixel electrode 1003 by way of a wiring layer (not shown).

Note that the NMOS transistors 1006 and 1005 share a common source electrode 1014.

Meanwhile, the gate electrode 1007 of the PMOS 1022 is connected to gate line 1011, while the drain electrode 1016 is connected to the drain electrode 1015 of the NMOS 1006 and also to the pixel electrode 1003 by way of a wiring layer (not shown). The source electrode 1017 is connected to a signal line formed by a wiring layer (not shown).

On the other hand, the gate electrode 1008 of the PMOS 1023 is connected to gate line 1012, while the drain electrode 1018 is connected to pixel electrode 1019 by way of a wiring layer (not shown).

Note that the PMOS transistors 1022 and 1023 share a common source electrode 1017.

Thus, MOS transistors can be densely arranged to achieve a high degree of integration by arranging side by side a pixel provided only with an NMOS located under the pixel electrode and a pixel provided only with a PMOS located under the pixel electrode, avoiding the arrangement of providing each pixel with a CMOS type pixel switch located under the pixel electrode.

This is made possible by eliminating a region for isolating different wells that has been considered to be necessary when MOS transistors having different polarities are arranged side by side. As a result, each chip and each pixel can be significantly down-sized to realize a high definition type display apparatus at reduced cost.

Also note that the NMOS transistors 1005 and 1006 share a common source region 1014 and the PMOS transistors 1022 and 1023 share a common source region 1017 to allow a higher degree of integration. This will be described by referring to FIG. 4 showing a cross sectional view taken along line 4—4 in FIG. 3. As shown in FIG. 4, the NMOS transistors 1005 and 1006 are arranged within PWL 1000 and share a common source electrode 1014. The source/drain region of each NMOS comprises high concentration n-type semiconductor regions 1100, 1101 and 1102 and a low concentration n-type semiconductor region 1103. The breakdown voltage of the source and that of the drain can be improved by arranging a low concentration region. An appropriate technique such as mask offset, DDD or side wall LDD may be used for forming a low concentration region.

The use and the non-use of a common source region will be compared by referring to the cross sectional view of FIG. 4. If, for example, the low concentration region 1103 and the high concentration n-type region 1101 have respective widths of 2 $\mu$m and 4 $\mu$m, while the contact size is 2 $\mu$m and the device isolating width of LOCOS is also 2 $\mu$m, the distance between the gate 1009 of the NMOS 1005 and the gate 1010 of the NMOS 1006 will be 2+4+2=8 $\mu$m (when a common source region is used) and 2 (low concentration n-type region)

+4 (high concentration n-type region)

+2 (device isolating region)

+4 (high concentration n-type region)

+2 (low concentration n-type region)=14 $\mu$m (when a common source region is not used).

Thus, the use of a common source region reduces the size by 6 $\mu$m. Similarly, a common source region may be shared for a PMOS.

Additionally, the embodiment can reduce the parasitic capacitance of the signal lines. The capacitance of each signal line principally consists of the capacitance of the wiring layer and the junction capacitance between the source electrode connected to the signal line and the well. The junction capacitance is substantially determined as a function of the area of the source region and hence, according to the invention, the capacitance of the source region will be $8/14$=57% of that of the corresponding source regions of a comparable known device from the above values of 8 $\mu$m and 14 $\mu$m.

If a half of the capacitance of a signal line is the junction capacitance of the source region, the present invention can reduce the capacitance of a signal line to about 85% of that of a signal line of a comparable known device.

A reduced signal line capacitance can by turn reduce the time required for transferring a video signal from a video line to a signal line to realize a high speed drive operation of a display panel. Additionally, the transfer switch to be used for transferring a video signal from a video line to a signal line can be dimensionally reduced to consequently reduce the chip size and the parasitic capacitance of the video line per se. As a result, the power of the driver required for applying a video signal to the display panel can be reduced to realize a high speed operation of the drive system at low cost.

As shown in FIG. 3, only a single n+ region is used for a pair of nMOS transistors.

With the above described arrangement, the parasitic capacitance of a signal line can be greatly reduced. More specifically, the source capacitance of a signal line by using a single common source electrode for a pair of transistors connected thereto. Additionally, the length of each signal line can be reduced by the use of the common source electrode so that the overall length of the signal lines of the display panel and hence the their overall capacitance can be significantly reduced to by turn reduce the overall resistance of the signal lines. Thus, zhe signal writing characteristics of the signal lines can be greatly improved to realize an exquisitely gradated signal writing operation. The use of dimensionally reduced chips will by turn ensure a high manufacturing yield and a high manufacturing efficiency to consequently lower the manufacturing cost of a display panel according to the invention. In addition to the down-sized chips, the sampling switches can be down-sized as a combined effect of the improved signal writing characteristics and the reduced capacitance and resistance of the signal lines so that the capacitance of the video signal lines (video lines) for carrying analog signal connected to the source electrodes of the sampling switches is reduced to by turn reduce the load of the peripheral circuits and the power consumption rate. The net result will be a display panel that operates excellently at low cost. The above pointed out advantages will become more remarkable and effective when the display panel comprises a greater number of pixels to achieve a higher degree of resolution.

Now, a liquid crystal display panel according to the invention and comprising a total of 1,024×768 pixels that meet the XGA standards will be described in detail.

Referring to FIG. 3, a pixel can be dimensioned to show a 20 $\mu$m square by using a common source region for a pair of transistors. If a common source region is not used, the pixel will show a 23 $\mu$m square. Then, the capacitance of the signal lines will be reduced by 15% from the non-use of a common source region in view of the fact that the source capacitance and the line capacitance will be reduced respectively to 57% and $20/23$. The line resistance will be reduced to $20/23$ or about 13% if a same line width is used so that the CR value will be reduced by as much as 25%.

Finally, the area occupied by the pixels in the liquid crystal display panel will be 17.664 mm×23.552 mm when no common source region is used and 15.36 mm×20.48 mm or ¾ of the former when a common source region is used for each pair of transistors. Thus, the advantages of the present invention as pointed out above will be clearly appreciated and hence the present invention can provide a liquid crystal display panel having an enhanced degree of resolution at low cost.

[Embodiment 2]

This embodiment comprises TFTs (thin film transistors) made of polysilicon or amorphous silicon as pixel switch transistors.

Figure 5:
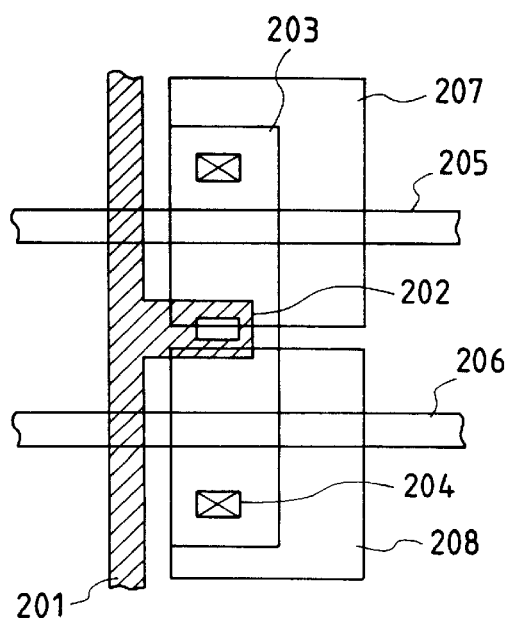
FIG. 5 is a schematic partial plan view of a second embodiment of liquid crystal apparatus according to the invention.

FIG. 5 shows a schematic plan view of a liquid crystal apparatus illustrating some of its characteristic aspects.

Referring to FIG. 5, there are shown a signal line 201, a common source region 202 for a pair of pixel TFTs, drain 203 of the TFT having electrode 1 (207), drain 204 of the TFT having electrode 2 (208) and a pair of drive lines (scanning line) 205 and 206, of which the drive line 205 corresponds to the gate line of the TFT comprising 203 and 202 whereas the drive line 206 corresponds to the gate line of the TFT comprising 208 and 202. Reference numerals 207 and 208 respectively denote reflection electrodes and the electrode 1 (207) is connected to the drain 203.

This embodiment is driven in a manner substantially same as Embodiment 1. More specifically, the drive line 205 corresponds to the drive line 102 in FIG. 2A, whereas the drive line 206 corresponds to the drive line 104 in FIG. 2C. The drive lines 103 and 105 are not necessary for this embodiment.

The above arrangement can be used not only with TFTs but also for nMOS or pMOS transistors that are directly formed on an Si wafer.

The pixel size of this embodiment can be further reduced than that of Embodiment 1, where a CMOS transistor is used for a pixel switch, to lower the capacitance and resistance of the signal lines even further so that signals can be written with an enhanced degree of gradation on a liquid crystal display panel that can be manufactured at reduced cost to operate highly efficiently.

Unlike Embodiment 1, this embodiment is characterized by a high power source voltage that may exceed the signal writing voltage because each pixel switch is subjected to a biasing effect of the substrate so that this embodiment may be suited for a low voltage liquid crystal drive mode.

Figure 6:
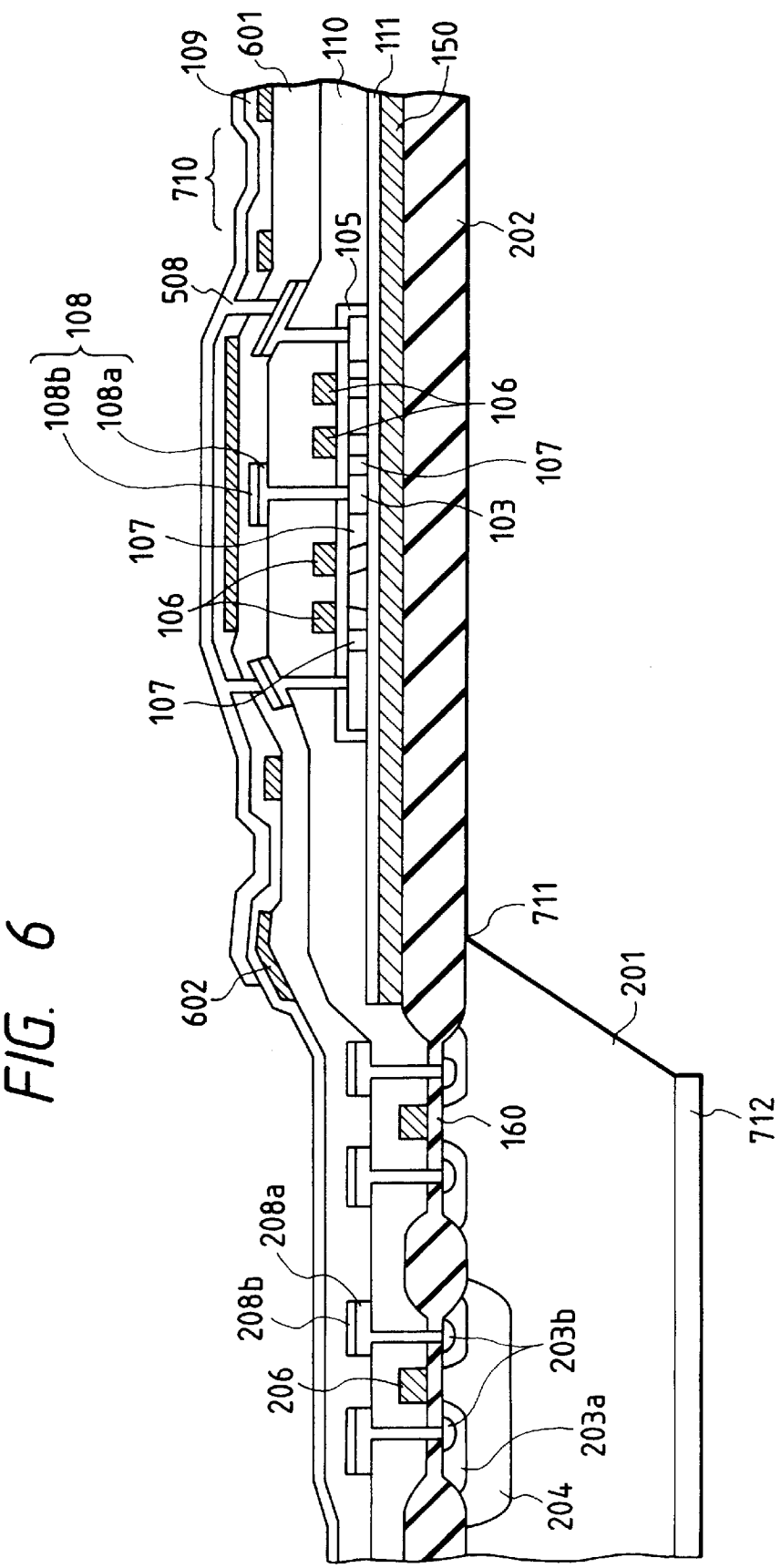
FIG. 6 is a schematic partial cross sectional view of another embodiment of liquid crystal apparatus according to the invention and illustrating a step of the process of manufacturing it.

Now, a process of preparing a transmission type liquid crystal apparatus using polysilicon (polycrystalline silicon) for the semiconductor layer of a switching transistor will be described by referring to FIG. 6.

Firstly boron ions are implanted into part of an n-type or p-type substrate 201 to a dose of $9 \times 10^{12}/cm^2$ with 60 KeV to produce a p-type well region (or an n-type well region) 204. Ions are driven at 1,150° C. for about 840 minutes in an atmosphere containing additional oxygen to a low extent, although the above value may be varied. Then, a pad oxide film and a nitride film are formed and patterned to produce a field oxide film 202. Thereafter, a nitride film 150 and an oxide film 111 are formed and patterned in a pixel region (or the oxide film may be formed by oxidizing the nitride film).

Thereafter, polycrystalline Si is deposited to form transistors in the pixel section. For example, a deposit of polycrystalline Si may be formed to a thickness of 50 to 400 nm under reduced pressure of 0.1 to 1.0 Torr at 600 to 700° C. by thermally decomposing silane gas that is diluted with nitrogen in a CVD apparatus, although some other technique may alternatively be used. Then, resist is applied and patterned. It will be removed after patterning the deposited polycrystalline Si. Gate oxide films 105 and 160 are formed simultaneously with a TFT (thin film transistor) region and a peripheral circuit region for the pixel section. The oxidation may preferably conducted at 1,150° C. in an oxygen containing atmosphere in order to increase the grain size of polycrystalline Si in the TFT region, although some other set of conditions may be used if appropriate. For example, the oxidation may alternatively be conducted at temperature between 850° C. and 1,200° C. in an oxygen atmosphere or in a mixture gas of oxygen and hydrogen.

Still alternatively a film formed of an NSG deposit may be used. Thereafter, deposits of polycrystalline Si 106 and 206 are formed for gate electrodes and source/drain regions in the peripheral circuit sections and in the pixel section are formed by ion implantation. For example, nMOS source/drain regions 103, 203b may be formed by phosphor ion implantation to a dose of $5 \times 10^{15}/cm^2$ with 95 KeV, while pMOS source/drain regions may be formed by $BF_2$ ion implantation to a dose of $3 \times 10^{15}/cm^2$ with 100 KeV.

During this process, the leak current is preferably suppressed by forming low concentration regions 107, 203a by means of NLD or PLD. Then, after forming an interlayer insulation film 110 with BPSG (boron-phosphor silicate glass), NSG (non-doped silicate glass) or PSG (phosphorus silicate glass) typically to a thickness of about 600 nm, it is patterned for a contact hole and then a wiring layer is formed. In this embodiment, an Al wire 108 doped with silicon to a concentration of 0.5 to 2% by using TiN as barrier metal was used. This is a material popularly used for semiconductor and TFT processes as electrode, although some other aluminum alloy, W, Ta, Ti, Cu, Cr, Mo or a silicide of any of them may alternatively and appropriately be used. After patterning the electrode layer, another interlayer insulation film 601 is formed and an etching mask is arranged on the rear surface of this film for patterning. Subsequently, a Ti film 602 is deposited by sputtering as light shielding film and then patterned. Thereafter, an insulation film 109 is formed to produce a capacitance by decomposing a mixture gas of silane gas with ammonia gas or $N_2O$ gas and forming a deposit at temperatures between 200 and 400° C. Then, the polycrystalline silicon is hydrogenated by heat treating it in hydrogen gas or a mixture gas of hydrogen with an inert gas such as nitrogen gas at 350 to 500° C. for 10 to 240 minutes. After forming a through hole, an ITO electrode 508 is formed as transparent electrode. Thereafter, liquid crystal is poured between it and the opposite electrode and the rear side thereof is etched down to the oxide film under the pixel section.

Figure 7:
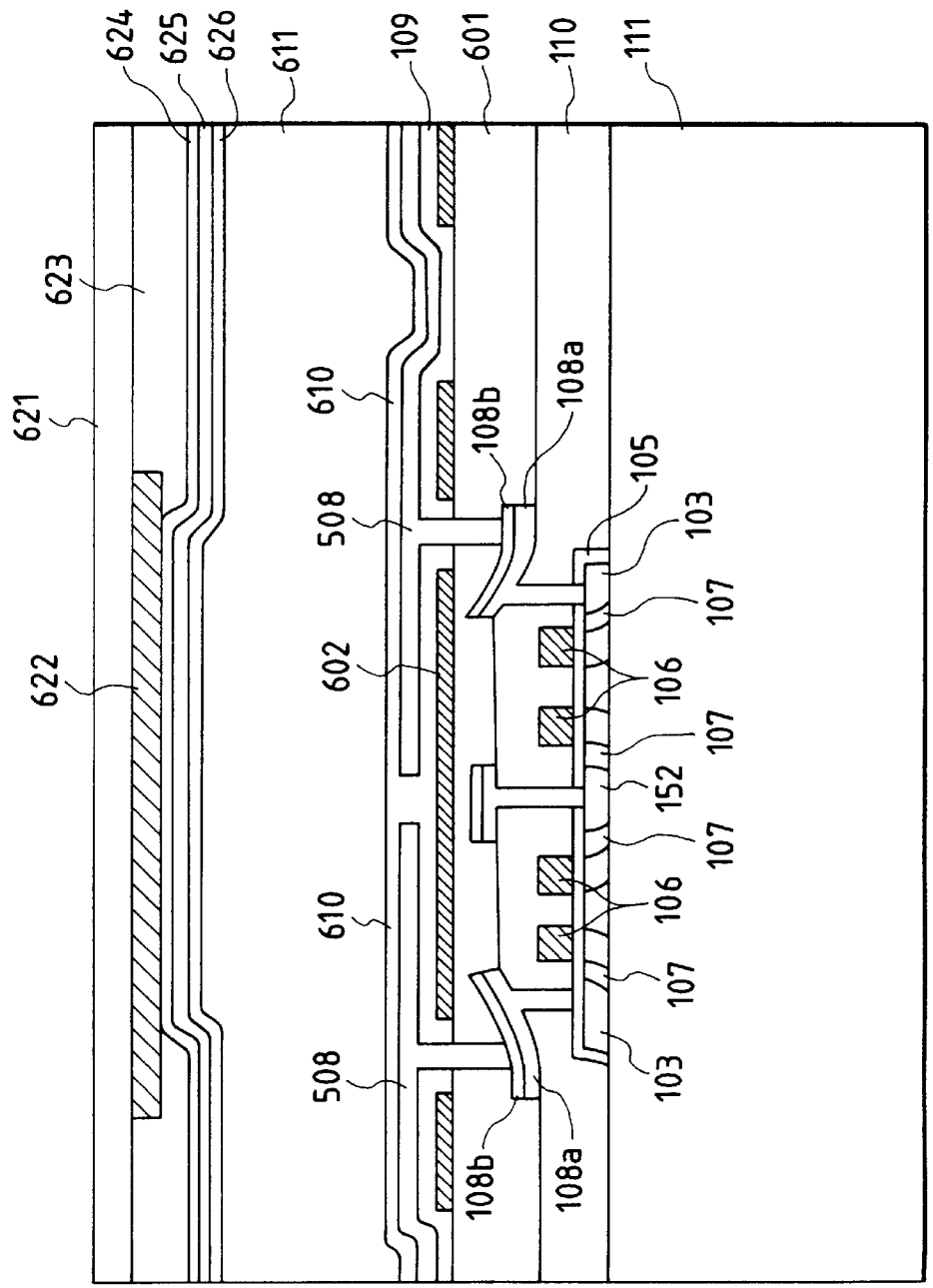
FIG. 7 is a schematic partial cross sectional view of still another embodiment of liquid crystal apparatus according to the invention and illustrating a step of the process of manufacturing it.

Now, a process of preparing a liquid crystal apparatus using low temperature polysilicon for TFTs will be described by referring to FIG. 7.

Firstly, a glass substrate 111 is subjected to buffer oxidation and then a 50 nm thick a-Si film deposit is formed thereon by means of an ordinary LPCVD technique. Thereafter, a polycrystallized silicon layer 103 is formed by irradiating it with KrF excimer laser. Then, an oxide film 105 is formed to a thickness of 10 to 100 nm to produce a gate oxide film. After forming the gate electrode 106, source/drain regions (152, 103, 107) are formed by ion implantation. After activating the impurity substances typically by annealing in a nitrogen atmosphere, a 500 nm thick insulation film 110 is formed. Subsequently, a contact hole is formed by patterning and wiring layers 108a and 108b are formed. More specifically, after forming a TiN film for the layer 108a by deposition by means of sputtering, an Al—Si film is formed for the layer 108b by deposition also by means of sputtering and the two layers are patterned together simultaneously.

Subsequently, a Ti film 602 is deposited by sputtering as light shielding film and then patterned. Thereafter, an insulation film 109 is formed to produce a capacitance by decomposing a mixture gas of silane gas with ammonia gas or $N_2O$ gas and forming a deposit at temperatures between 200 and 400° C. Then, the polycrystalline silicon is hydrogenated by heat treating it in hydrogen gas or a mixture gas of hydrogen gas with an inert gas such as nitrogen gas at 350 to 500° C. for 10 to 240 minutes. After forming a through hole, an ITO electrode 508 is formed as transparent electrode. Thereafter, liquid crystal 611 is poured between it and the opposite electrode. The opposite electrode is typically prepared by forming a black matrix 622, a color filter 623, an ITO transparent common electrode 624, a protection film 625 and an orientation film 626 on a glass substrate 621.

[Embodiment 3]

Figure 8:
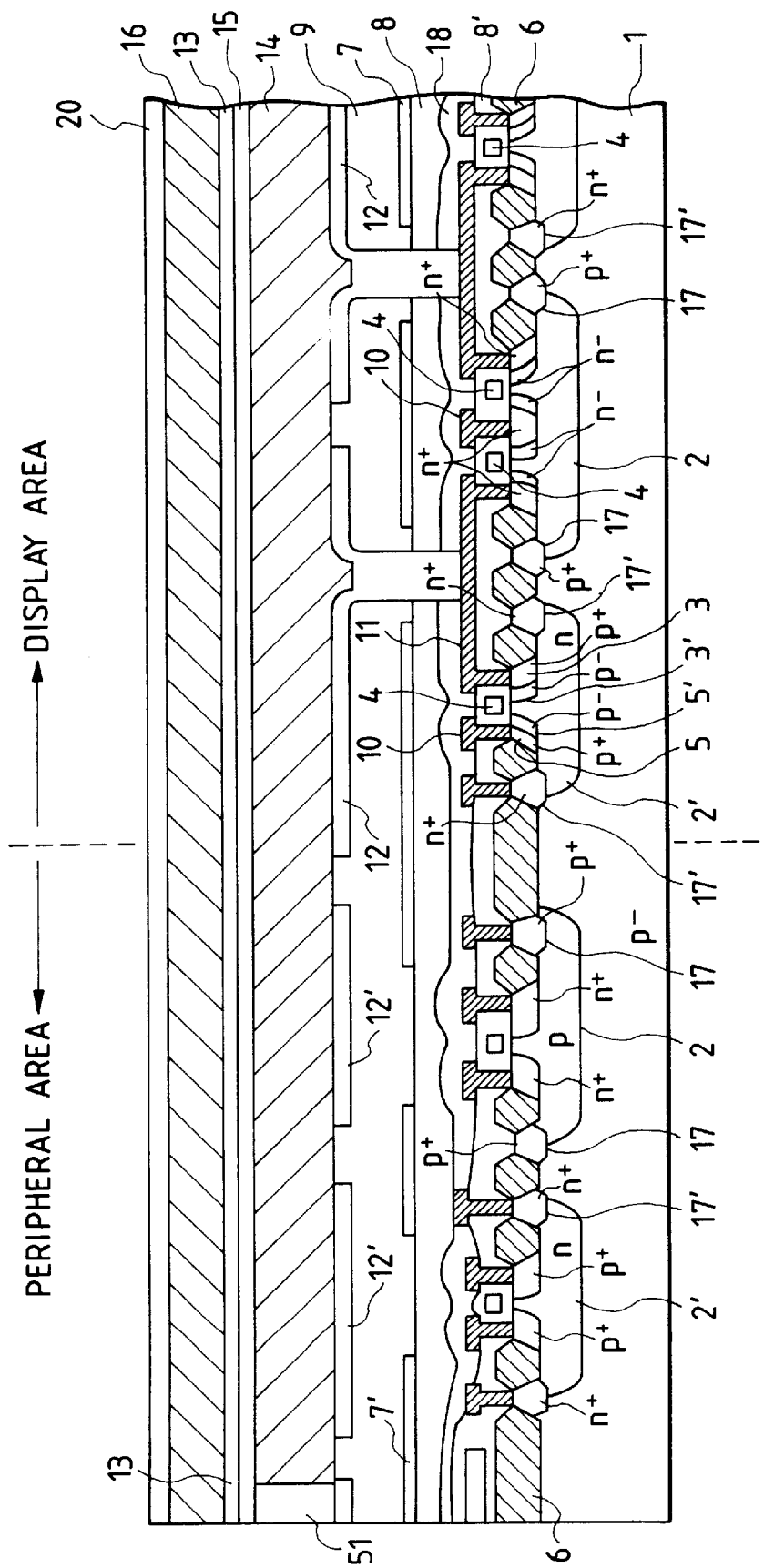
FIG. 8 is a schematic partial cross sectional view of still another embodiment of liquid crystal apparatus according to the invention and illustrating a step of the process of manufacturing it.

FIG. 8 is a schematic cross sectional view of a typical liquid crystal panel according to the invention.

Referring to FIG. 8, there are shown a semiconductor substrate 1 and p-type and n-type wells 2 and 2' along with drain regions 3, 3', gates 4 and source regions 5 and 5' of transistors.

As seen from FIG. 8, since a high voltage between 20 and 35V is applied to the transistors of the display region, the source/drain layer is not aligned with but offset from the gate and low concentration $n^-$ and $p^-$ layers 3' and 5' are arranged therebetween. The offset is preferably between 0.5 and 2.0 $\mu m$.

Meanwhile, part of the peripheral circuits is shown in FIG. 8. It will be seen that the gate is aligned with the source/drain layer in that part.

While the offset of the source/drain layer is described above for a specific example, it may be modified and the gate length may be optimized to adapt itself to the withstand voltage. On the other hand, the gate is aligned with the source/drain layer in the illustrated part of the peripheral circuits in order to reduce the size of the transistors and improve the efficiency of driving them because it is a logic type circuit that may be driven only by 1.5 to 5V.

The substrate 1 is made of a p-type semiconductor material and shows the lowest potential (normally the ground potential). A voltage to be applied to the pixels which is between 20 and 35V is also applied to the n-type well in the display region, whereas a logic drive voltage between 1.5 and 5V is applied to the logic section of the peripheral circuits. With this arrangement, the device can operate optimally for the voltages so that not only the chip size may be reduced but the pixels may be driven at high speed to display high quality images.

Otherwise, there are shown in FIG. 8 a field oxide film 6, source electrodes 10 connected to respective data lines and drain electrodes 11 connected to respective pixel electrodes along with pixel electrodes 12.

Reference numeral 7 denotes a light shielding layer covering both the display region and the peripheral region and typically made of Ti, TiN, W or Mo. As seen from FIG. 8, the light shielding layer covers the entire display region except the areas connecting the pixel electrodes and the drain electrodes, whereas it is removed from areas where the line capacitance can be large such as part of the video lines and the clock lines and covers only the pixel electrode layer where light can get into to give rise to operational failures of the circuit in an ingenious manner in order to transfer high speed signals without problem.

Reference numeral 8 denotes an insulation layer arranged under the light shielding layer 7 and comprising a P-SiO layer that is smoothed by means of SOG and another P-SiO layer covering it in order to ensure the insulation effect of the layer 8. The smoothing operation using SOG may be replaced by an operation of forming a P-TEOS film, covering it with a P-SiO film and treating the insulation layer by means of a CMP process.

Reference numeral 9 denotes an insulation layer formed between the reflection electrodes and the light shielding layer so that the charge holding capacitance of the reflection electrodes is formed by way of this insulation layer. In order to provide a large capacitance, a high permittivity P-SiN or $Ta_2O_5$ layer or a multilayer structure thereof with $SiO_2$ may be effective if used in place of an $SiO_2$ layer. The light shielding layer may be effective if it is formed on a smooth metal layer typically made of Ti, TiN, Mo or W as a light shielding layer and has a film thickness between 500 and 5,000 angstroms.

Otherwise, there are shown a liquid crystal material 14, a common transparent electrode 15, a common electrode substrate 16 (opposite substrate), highly concentrated impurity regions 17, and 17', a display region 19 and an anti-reflection film 20.

As seen from FIG. 8, the highly concentrated impurity layers 17 and 17' formed under the transistors have the polarity same as that of the wells and formed in and around the wells. With this arrangement, high quality images can be displayed if a high amplitude signal is applied to the source because the potential of the wells is securely held to a desired level due to the provision of a low resistance layer.

Additionally, the provision of the highly concentrated impurity layers 17 and 17' between the n-type wells and the p-type wells with a field oxide film interposed therebetween makes it unnecessary to arrange a channel stop layer that is normally placed directly under the field oxide film for ordinary MOS transistors.

Since the highly concentrated impurity layers can be formed during the process of preparing the source/drain regions, the number of masks and that of processing steps for forming the layers can be reduced to lower the overall manufacturing cost.

Reference numeral 13 in FIG. 8 denotes an anti-reflection film arranged between the common transparent electrode and the opposite substrate in order to reduce the interface reflectivity in view of the refractivity of the liquid crystal arranged there. he insulation film preferably has a refractivity lower than that of the opposite substrate and also that of the transparent electrode.

While a p-type semiconductor substrate 1 is used in FIG. 8, the substrate may alternatively be made of an n-type semiconductor material. The well regions 2 is of the conductivity type opposite to that of the well regions 2'. Therefore, the well regions 2 and 2' of FIG. 8 are of the p-type and the n-type, respectively. The p- and n-type well regions 2 and 2' are preferably implanted with an impurity substance to a concentration level higher than the semiconductor substrate 1. Thus, if the impurity concentration of the semiconductor substrate 1 is between $10^{14}$ and $10^{15}(cm^{-3})$, that of the well region 2 is preferably between $10^{15}$ and $10^{17}$ $(cm^{-3})$.

The source electrodes 10 are connected to the respective data lines by way of which display signals are transmitted, whereas the drain electrodes 11 are connected to the respective pixel electrodes 12. Wires typically made of Al, AlSi, AlSiCu, AlGeCu or AlCu are used for the electrodes 10 and 11. A stable contact can be secured and a reduced contact resistance can be provided by using a barrier metal layer made of Ti and TiN under the electrodes 10 and 11.

The pixel electrodes 12 are typically made of a highly reflective material that can provide a smooth surface. Materials that can be used for the pixel electrodes include Al, AlSi, AlSiCu, AlGeCu and AlC that are normally used for wires as well as Cr, Au and Ag. Preferably, the surface of the underlying insulation layer and that of the pixel electrodes 12 are treated by means of a chemical/mechanical polishing (CMP) technique in order to improve their smoothness.

Figure 9:
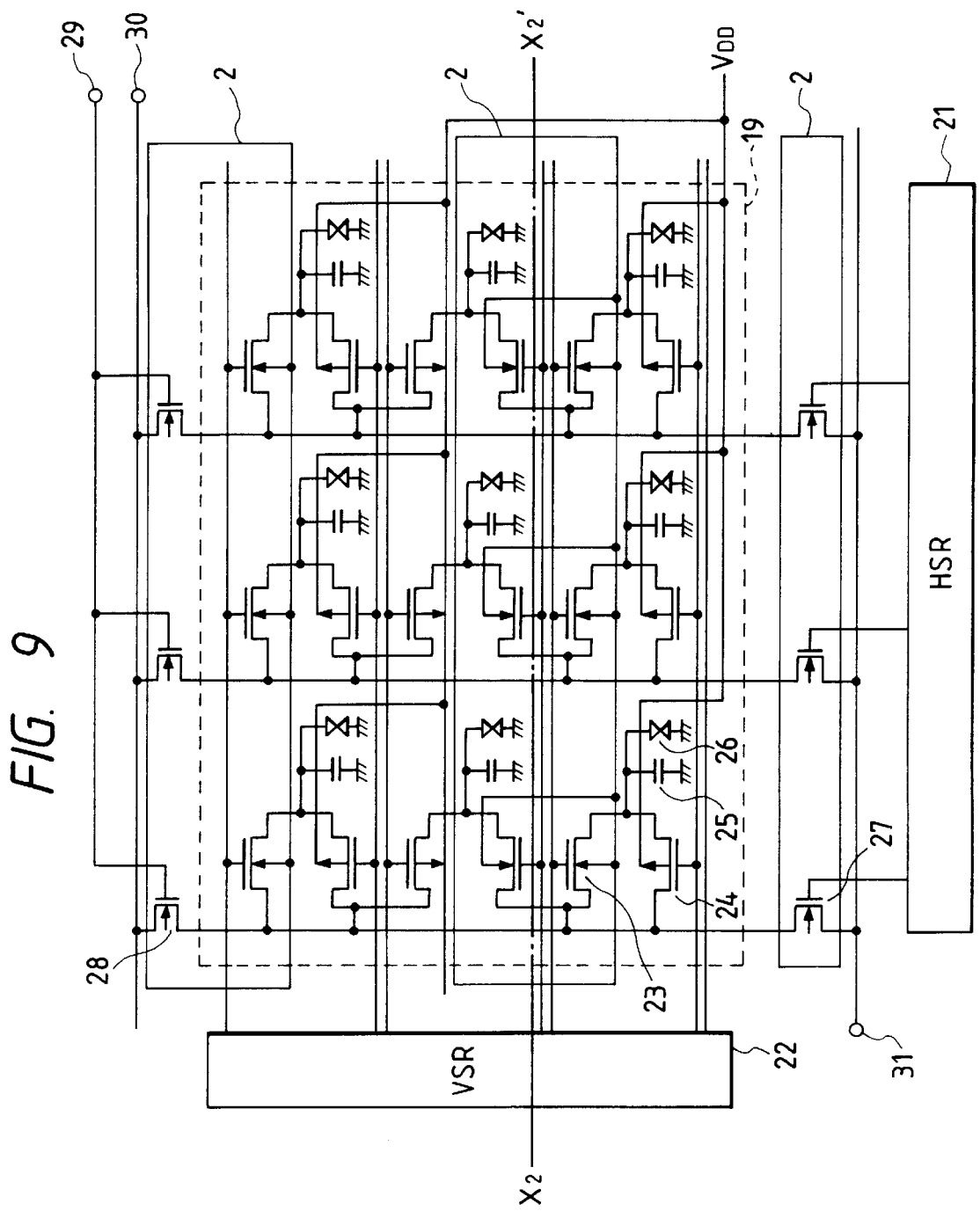
FIG. 9 is a schematic circuit diagram of an embodiment of liquid crystal apparatus according to the invention and including peripheral circuits.

FIG. 9 is a schematic circuit diagram of a liquid crystal display apparatus comprising a liquid crystal display panel having a configuration as described above.

Referring to FIG. 9, there are shown a horizontal shift register 21, a vertical shift register 22, n-channel MOSFETs 23, p-channel MOSFETs 24, hold capacitances 25, liquid crystal elements 26, signal transfer switches 27, reset switches 28, a reset pulse input terminal 29, a reset power supply terminal 30 and a video signal input terminal 31.

The hold capacitances 25 in FIG. 9 are those for holding respective signals between the pixel electrodes 12 and the common transparent electrode 15 in FIG. 8. The potential of the substrate is applied to the well regions 2.

In this example, the transmission gates of the rows are so configured that the n-channel MOSFETs 23 are located above the respective p-channel MOSFETs 24 on the first row whereas the p-channel MOSFETs 24 are inversely located above the respective n-channel MOSFETs 23 and so on. It should be noted that not only the stripe-shaped wells are held in contact with the power supply line in the periphery of the display region but there are provided fine power supply lines in the display region for ensuring a tight contact.

It should be noted here that the stability of the resistance of the wells is very important for the operation of the display apparatus. Therefore, in this example, the contact area or the number of contacts of the n-wells within the display region is made greater than its counterpart of the p-wells. Since the p-wells are held to a constant potential on the p-type substrate, the substrate plays an important role as a low resistance body. Thus, while the performance of the n-wells arranged like islands may be fluctuated seriously by input and output signals of the sources and drains, such fluctuations are prevented by increasing the number of contacts with the upper wiring layer to ensure high quality images to be displayed on the screen of the liquid crystal panel.

Video signals (including ordinary video signals and pulse-modulated digital signals) are applied to the video signal input terminal 31 to turn on and off the signal transfer switches 27, which output them to the data lines according to the pulse from the horizontal shift register 21. The vertical shift register 22 applies a high pulse to the gates of the n-channel MOSFETs 23 of the selected row and a low pulse to the gates of the p-channel MOSFETs 24 of that row.

As described above, the switches of the pixel section are constituted by monocrystalline CMOS transmission gates that have an advantage that the signal to be written on the pixel electrodes does not rely on the threshold value of the MOSFETs so that source signals can be written without restrictions.

Additionally, since the switches are formed by monocrystalline transistors, they do not show any instability of operation on the boundary areas of the crystal grains of polysilicon TFTs to realize a reliable and stable high speed drive operation.

Now, the peripheral circuits of the display panel will be described by referring to FIG. 10.

Figure 10:
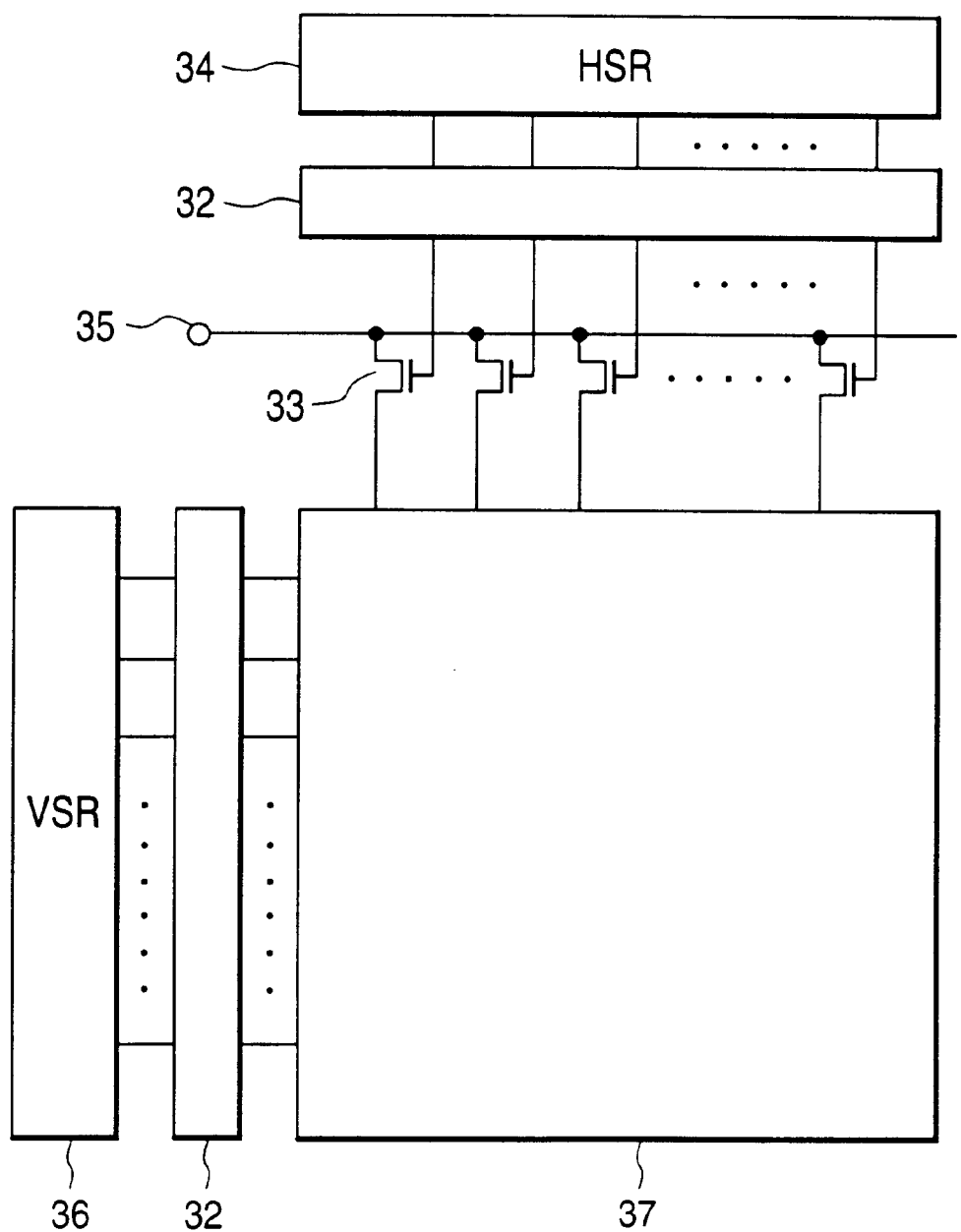
FIG. 10 is a schematic block diagram of a liquid crystal apparatus according to the invention.

FIG. 10 is a schematic block diagram of the peripheral circuits.

In FIG. 10, there are shown a level shifter circuit 32, video signal sampling switches 33, a horizontal shift register 34, a video signal input terminal, a vertical shift register 36 and a display region 37.

With the above circuit arrangement, the logic circuits including the horizontal and vertical shift registers can be driven with a low voltage of 1.5 to 5V to realize a quick and low voltage operation regardless of the video signal amplitude. Both the horizontal and vertical shift registers can be scanned in opposite directions by means of a selection switch so that the panel does not need any alterations to make itself adapted to the positional arrangement of the optical system and hence to different products to a great advantage of the panel particularly in terms of the manufacturing cost of such products.

While the video signal sampling switches 33 in FIG. 10 comprise unipolar transistors, they may alternatively comprise different devices to write an input video signal to all the signal lines by means of CMOS transmission gates.

When CMOS transmission gates are used, their operation may be fluctuated by video signals depending on the area of the NMOS gates and that of the PMOS gates as well as on the difference between the overlap capacitance of the gates and that of the source/drain regions. However, this problem can be prevented and a video signal can be written on the signal lines by connecting the sources and the drains of MOSFETs having a gate length equal to a half of that of the MOSFETs of the sampling switches 33 of the corresponding polarities to the respective signal lines and applying a pulse with the opposite phase. With this arrangement, images of higher quality can be displayed on the screen of the display panel.

Now, a method for accurately synchronizing a video signal and a sampling pulse will be described by referring to FIG. 11. To achieve this objective, the delay amount of the sampling pulse have to be varied.

Figure 11:
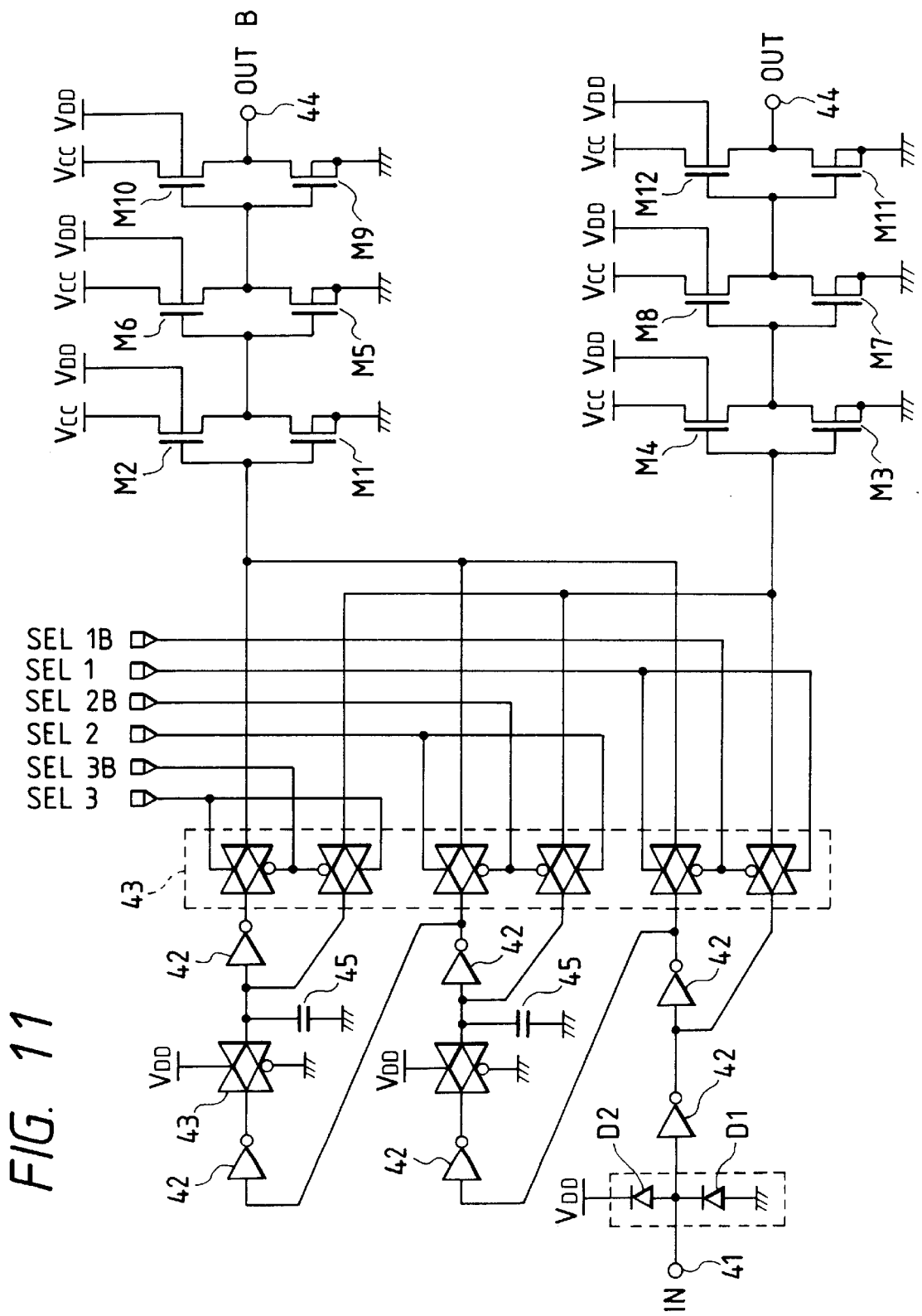
FIG. 11 is a schematic circuit diagram of an embodiment of liquid crystal apparatus according to the invention and including a synchronizing circuit.

FIG. 11 is a circuit diagram of a liquid crystal apparatus comprising a synchronous circuit illustrating the relationship between a video signal and a sampling pulse in terms of synchronization.

Referring to FIG. 11, there are shown pulse delaying inverters 42, switches 43 for selecting one of the pulse delaying inverters, output terminals 44 for an output with a controlled delay amount (OUT B representing an opposite phase output and OUT representing an in-phase output), capacitances 45 and a protection circuit 46.

By a combined use of any of SEL 1 (SEL 1B) through SEL 3 (SEL 3B), a sampling pulse can be made to pass through a selected number of delaying inverters 42.

Due to the synchronous circuit built in the display panel, if the symmetry of an externally applied pulse is damaged for some reason attributable to jigs in terms of delay amount for the three panels of red, green and blue of the display panel, the symmetry can be recovered by means of said selection switches to display clear images that are free from color breakups of red, blue and green due to phase shifts of the pulse in a high frequency band. Alternatively, the delay amount can be regulated by means of temperature correction using the temperature measured by a built in diode and a stored reference table.

Now, the liquid crystal panel of liquid crystal display apparatus according to the invention will be described in terms of the components and the liquid crystal substance. The flat liquid crystal panel of FIG. 8 is configured with an opposite substrate and its common electrode substrate 16 is made to show undulations in order to prevent reflections at the interface with the common transparent electrode 15 arranged on a surface of the substrate 16. The common electrode substrate 16 is provided on the opposite surface thereof with an anti-reflection film 20. These components may be made to show undulated profiles by polishing them with fine sands in order to improve the contrast of the displayed images.

Polymer network liquid crystal PNLC is used for the liquid crystal of this panel, although polymer dispersion liquid crystal PDLC may alternatively be used as polymer network liquid crystal. Polymer network liquid crystal PNLC can be produced by means of a polymerization phase separation technique, where a solution of liquid crystal and a polymeric monomer or oligomer is prepared and injected into a cell with a known technique and then the liquid crystal and the polymer are phase-separated by means of UV polymerization to form a polymer network in the liquid crystal. PNLC contains liquid crystal to a large extent (70 to 90 wt %).

Scattering of light can be reduced in PNLC when nematic liquid crystal having a highly anisotropic refractivity ($\Delta n$) is used for it. A low voltage drive is made possible by the use of nematic liquid crystal having a dielectrically highly anisotropic property ($\Delta \epsilon$). Scattering of light can be made strong enough for achieving a sharp contrast for the display of images when the size of the polymer network expressed in terms of the distance between the centers of adjacent meshes is between 1 and 1.5 ($\mu$m).

Now, the relationship between the sealing arrangement and the configuration of the panel will be described by referring to FIG. 12.

Figure 12:
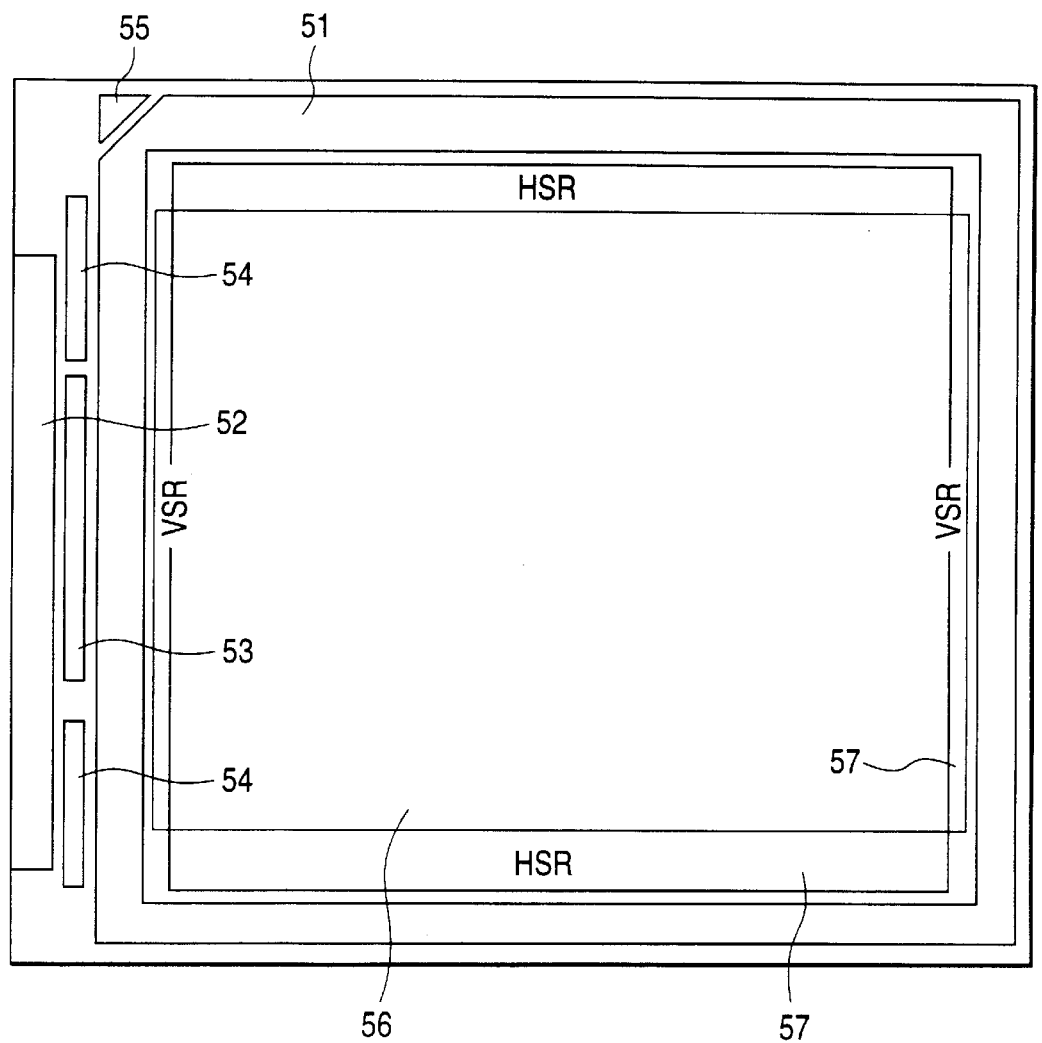
FIG. 12 is a schematic plan view of a liquid crystal panel that can be used for the purpose of the invention.

FIG. 12 is a schematic plan view of the display panel illustrating the sealing arrangement.

In FIG. 12, there are shown a sealing member 51, an electrode pad unit 52, a clock buffer circuit 53 and an amplifier 54, which amplifier operates as an output buffer to be used for an electric test of the panel. Otherwise, there are also shown an Ag paste sections 55 that show an electric potential same as that of the opposite substrate, a display section 56 and a peripheral circuit section 57 typically comprising SRs and other devices.

As seen from FIG. 12, circuits are arranged both inside and outside of the seal in order to reduce the overall chip size. While all the pads that are arranged on a lateral side of the panel, they may alternatively be arranged on the top or bottom side of the panel or on two or more than two sides of the panel for handling a high speed clock efficiently.

When preparing a liquid crystal apparatus by using an Si substrate, the electric potential of the substrate can fluctuate to give rise to operational failures of the panel if a strong beam of light emitted from a projector strikes one or more than one lateral walls of the substrate. Therefore, it is highly desirable that the peripheral circuit sections at the top and the lateral sides of the panel are realized in the form of substrate holders that can shield light. Additionally, the Si substrate is preferably provided on the rear surface thereof with a plate of a metal having a high thermal conductivity such as Cu that is adhered to the substrate by means of an adhesive agent also having a high thermal conductivity, the metal plate operating as a holder.

The pixel electrodes of a liquid crystal display apparatus according to the invention may be realized in the form of reflection type electrodes. If such is the case, the surface of the electrodes is preferably polished by chemical-mechanical polishing (CMP) to make the electrode surface mirror-shine and free from undulations. Unlike the ordinary polishing process involving a step of patterning the metal plate to be conducted prior to a polishing operation, the chemical-mechanical polishing technique comprises steps of producing electrode-forming grooves by etching for an electrode pattern in an insulated region, forming a metal film, removing the metal of all the areas of the insulated region other than the electrode pattern and polishing the metal on the electrode pattern to make it flush with the insulated region. It should be noted however that, when this technique is used, the wires formed there show a width by far greater than any other areas of the region so that polymer can be deposited on the wires to obstruct the patterning operation during the etching process if ordinary etching equipment is used.

In view of this problem, the etching conditions of a conventional oxide film type ($CF_4/CHF_3$ type) etching operation were studied by the inventors of the present invention.

Figure 13A:
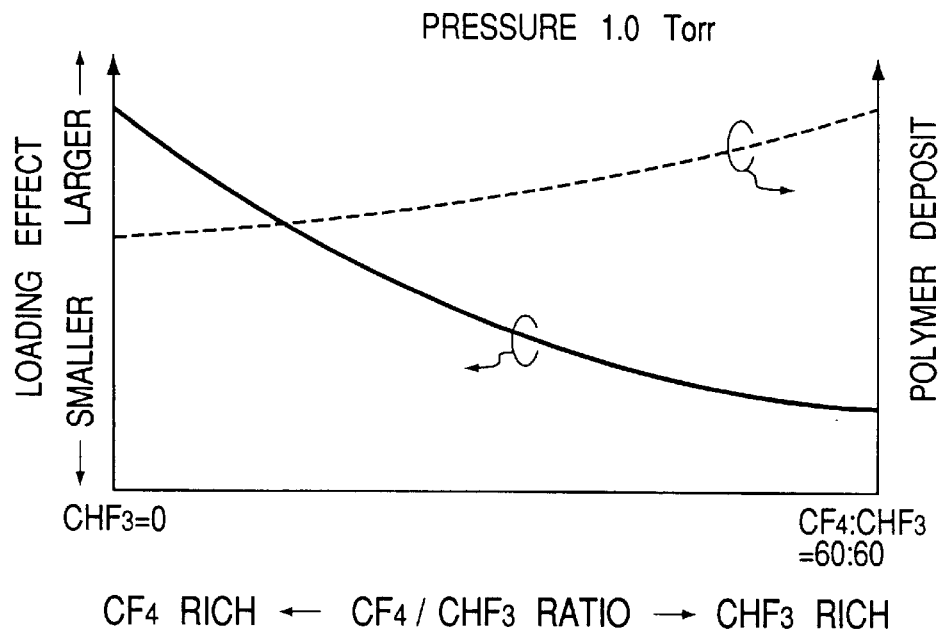
FIGS. 13A and 13B are graphs for determining the acceptability and non-acceptability of an etching operation to be used for manufacturing a liquid crystal apparatus according to the invention.
Figure 13B:
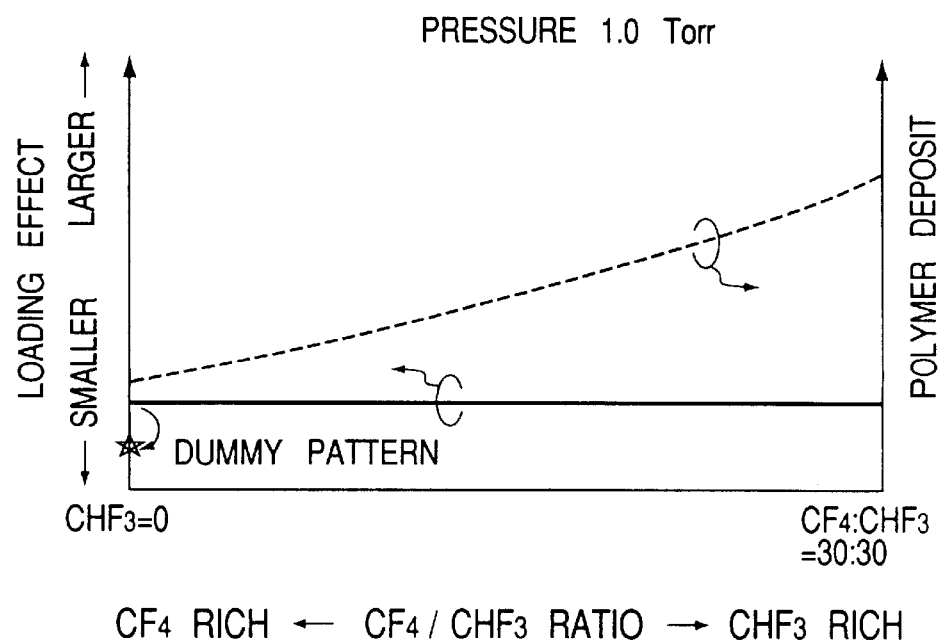

FIGS. 13A and 13B are graphs showing the effect of a conventional etching process and that of an etching process that can be used for the purpose of the invention.

FIG. 13A illustrates the effect of a conventional etching process using a total pressure of 1.7 Torr, whereas FIG. 13B shows that of an etching process using a total pressure of 1.0 Torr, which is designed for the purpose of the invention.

It will be seen that, while the polymer deposit is reduced by reducing the concentration of easily depositable $CHF_3$ gas under the conditions of the conventional process, the dimensional discrepancies (loading effect) of the patterns located relatively close to the resist and those located remotely from the resist remarkably increase to make the process unfeasible.

On the other hand, it will be appreciated that, with the etching process designed for the purpose of the invention, the loading effect can be significantly suppressed when the pressure is gradually reduced until it gets to below 1 Torr and a remarkable etching effect can be obtained by using only $CF_4$, eliminating the use of $CHF_3$.

Additionally, it was also found that practically no resist exists in the pixel electrode regions, whereas the peripheral areas are occupied by resist. Therefore, it is practically impossible to produce any structure in the peripheral areas unless dummy pixels having a profile like that of the pixel electrodes are formed in the peripheral areas of the display region.

With this arrangement, the step between the display section and the peripheral areas or the sealing member typically observed in known comparable display apparatus is eliminated and the gaps of the apparatus are dimensioned accurately to achieve an uniform pressure to be applied to the entire surface area and reduce any uneven injection of liquid crystal, resulting in a high yield of manufacturing liquid crystal display apparatus that can display high quality images.

Now, an optical system that can be used in a reflection type liquid crystal panel according to the invention will be described by referring to FIG. 14.

Figure 14:
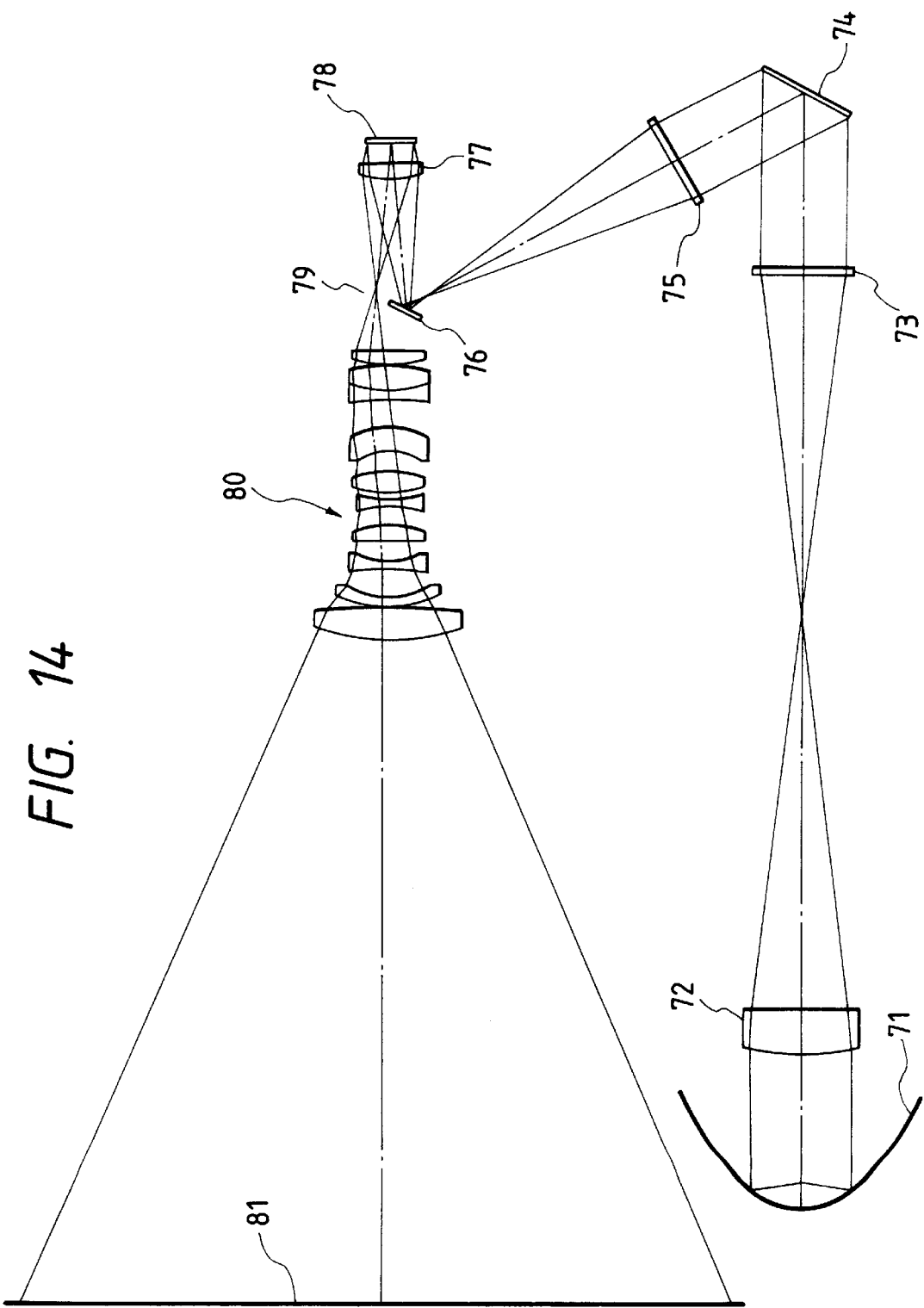
FIG. 14 is a schematic illustration of a liquid crystal projector comprising a liquid crystal apparatus according to the invention.

FIG. 14 is a schematic side view of an optical system to be used in a reflection type liquid crystal panel according to the invention.

In FIG. 14, there are shown a light source 71, a focusing lens for producing a focused image of the light source 72, Fresnel lenses 73 and 75 and a color separation optical device 74 which is preferably a dichroic mirror or a diffraction grating.

The optical system further comprises a mirror 76 for leading the separated red, green and blue beams of light to respective R, G and B panels, a view lens 77 for illuminating the panel with parallel rays of light obtained by collimating focused beams, a reflection type liquid crystal apparatus 78 and an iris (not shown) located at position 79. Reference numeral 80 denotes a projection lens and reference numeral 81 denotes a screen typically of a double-layered structure comprising a Fresnel lens for collimating projected light and a lenticular lens for expanding the viewing angle vertically and horizontally.

While only a single panel of single color is shown in FIG. 14 for simplicity, a total of three panels of three primary colors are actually provided, although it may be appreciated that a single panel arrangement may feasibly be used in place of the three panels when a micro lens array is formed on the surface of the reflection panel to cause different incident rays of light to strike respective pixel regions.

As a voltage is applied to the liquid crystal layer of the liquid crystal apparatus 78, incident light is regularly reflected by the pixels and then passes the iris located at position 79 before it is projected onto the screen 81.

On the other hand, incident light striking the reflection type liquid crystal apparatus 78 when no voltage is being applied to the liquid crystal layer and the latter is in a scattered state will be isotropically scattered and hence no light will strike the injection lens 80 except scattered rays of light that are directed toward the aperture of the iris located at position 79 so that consequently the display screen remains evenly dark.

As will be appreciated from the above description of the optical system, since no polarizing plate is required for it and the signal light is reflected by the entire surface of the pixel electrode having a high reflectivity before it strikes the projection lens, the display panel can provide a degree of brightness that is twice to three times higher than that of any known comparable display panel. The noise component of light is minimized and a high contrast display capability is provided since anti-reflection measure is taken on the surface of the opposite substrate and the interface thereof in this example. Additionally, all the optical devices (lenses, mirrors and so on) can be down-sized to reduce the manufacturing cost and the weight of the display apparatus because the panel is adapted to dimensional reduction.

Any unevenness or fluctuations in the colors and the brightness on the display screen due to the unevenness or fluctuations in the colors and the brightness of the light source can be eliminated by inserting a (fly eye lens type or rod type) integrator between the light source and the optical system.

Figure 15:
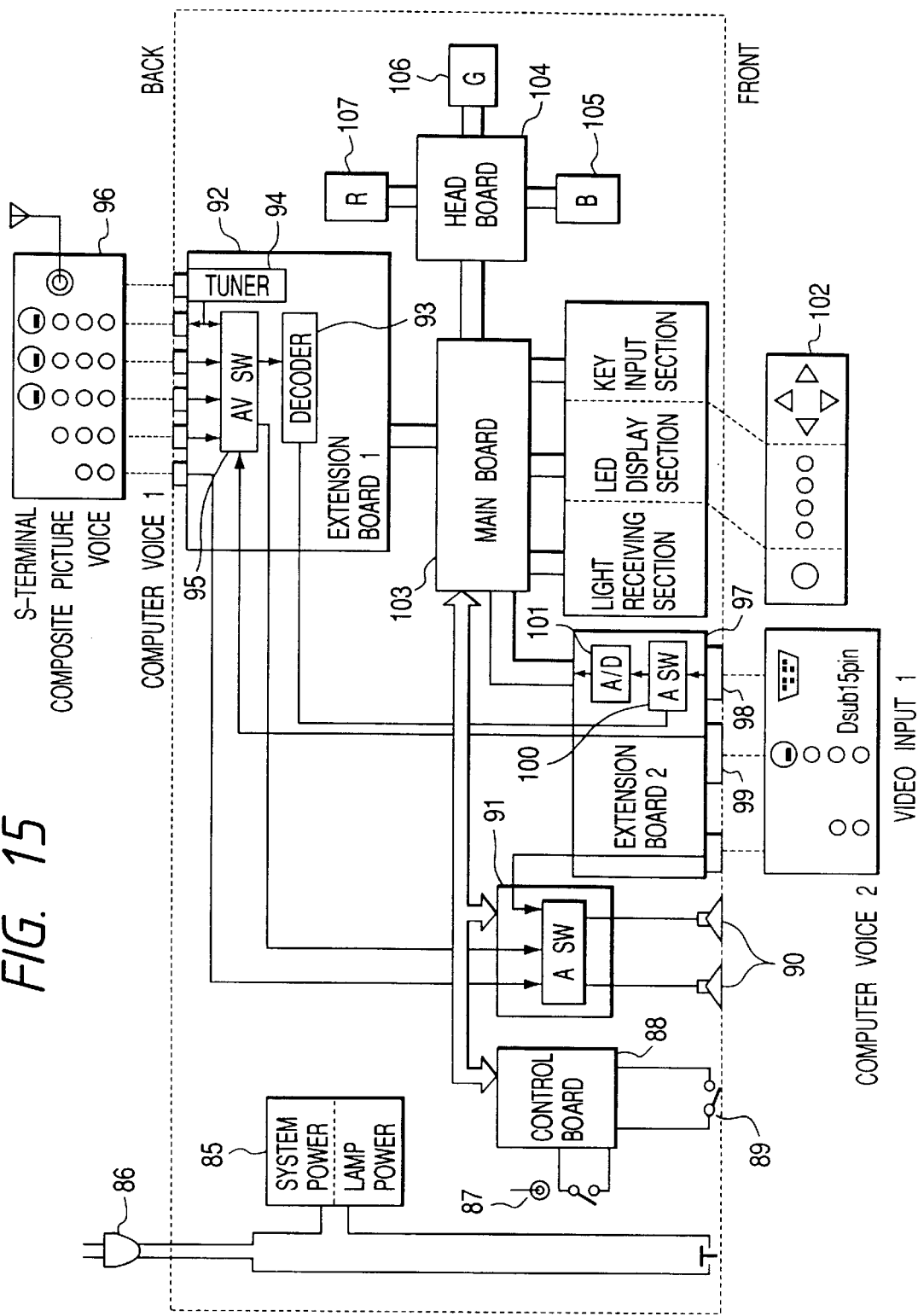
FIG. 15 is a schematic block diagram of the circuits arranged within the liquid crystal projector of FIG. 14.

FIG. 15 is a schematic block diagram of the peripheral electric circuits other than the panel.

In FIG. 15, there are shown a power source unit 85 that comprises a power source for lamps and a system power source for driving the panel and the signal processing circuits, a plug 86, a lamp temperature sensor 87 for detecting any abnormal temperature of any of the lamps, a control board 88 for deenergizing any lamps showing abnormal temperature, and a filter safety switch 89 for deenergizing any failed devices other than lamps. For example, an attempt for opening the high temperature lamp housing box of the apparatus will fail because of the safety measure provided to obstruct the attempt. Otherwise, there are also shown a speaker 90, an audio-board that can be provided with a built-in processor for 3-D sound and surround sound effects, an extension board 92, or extension board 1, comprising input terminals connected to an external apparatus 96 for providing signals including those for S-terminals, composite pictures and voices, selection switches 95 for selecting one or more than one appropriate signals and a tuner 94. Signals are transmitted from the extension board 1 to extension board 2 by way of a decoder 93. The extension board 2 comprises Dsub 15 pin terminals connected to separate signal sources such as video recorders and/or computers and signals applied to it by way of a switch 100 are converted into digital signals by means of an A/D converter 101. Reference numeral 103 denotes a main board comprising a memory and a CPU as principal components.

NTSC signals that have been A/D converted are stored in the memory so that missing signals may be generated by interpolation in order to allocate them appropriately to a large number of pixels and signals may be subjected to processing operations suited for a liquid crystal apparatus including gamma transform edge emphasis, brightness regulation and bias regulation.

Besides NTSC signals, computer signals may be subjected to processing operations including resolution conversion if the panel is a high resolution XGA panel and VGA signals are provided. In addition to the operation of processing picture data, the main board operates for synthetically combining a plurality of picture data NTSC signals with computer signals. The output signal of the main board is subjected to a serial/parallel conversion to take a form that is less affected by noise before it is transmitted to a head board 104, where the signal is once again subjected to a parallel/serial conversion and then to a D/A conversion and written onto panels 105, 106 and 107 according to the number of video lines of the panels by way of an amplifier. Reference numeral 102 denotes a remote control panel that allows a computer display to be manipulated in a simple manner like a TV display.

[Embodiment 4]

This embodiment is a so-called single panel type full color display apparatus comprising a liquid crystal apparatus (panel) that is provided with micro lenses.

The applicant of the present patent application proposed a new display panel in Japanese Patent Application No. 9-72646 to solve the problem that the mosaic arrangement of R, G and B pixels is noticeable to the viewer to degrade the quality of the image displayed on the screen of known display panels that are provided with micro lenses. The display panel proposed in Japanese Patent Application No. 9-72646 comprises a pixel unit array obtained by arranging a set of pixel units at a predetermined pitch, each pixel unit comprising three pixels of a first color, a second color and a third color, in which the first color pixel and the second color pixel are arranged in a first direction and the first color pixel and the third color pixel are arranged in a second direction different from the first direction, so that the two pixels arranged in the first direction shares the pixel of the first color with the two pixels arranged in the second direction, and a plurality of micro lenses arranged on the pixel unit array on the substrate at a pitch corresponding to the pitch of pixel arrangement in the first direction and that of pixel arrangement in the second direction.

In this embodiment, a display panel proposed in the above cited Japanese Patent Application No. 9-72646 is applied to a liquid crystal apparatus and a display apparatus according to the invention.

FIGS. 16A through 16C are schematic illustrations of the optical system of a projection type liquid crystal display apparatus comprising the embodiment of display panel, showing only a principal area thereof. Note that FIG. 16A is a plan view, FIG. 16B is a front view and FIG. 16C is a side view.

Referring to FIGS. 16A through 16C, the optical system comprises a projection lens 1 for projecting the pixel data displayed on display panel (liquid crystal panel) 2 that comprises a liquid crystal apparatus provided with micro lenses onto a predetermined plane, a polarized beam splitter (PBS) 3 typically designed to transmit S-polarized beams and reflect P-polarized beams, an R (red light) reflecting dichroic mirror 40, a B/G (blue and green light) reflecting dichroic mirror 41, a B (blue light) reflecting dichroic mirror 42, a high reflection mirror 43 for reflecting beams of all colors, a Fresnel lens 50, a concave lens (positive lens) 51, a rod type integrator 6, an elliptic reflector 7 and an arc lamp (light source) 8 such as a metal hallide or a UHP having its light emitting plane 8a located at the center of the reflector 7.

Figure 17A:
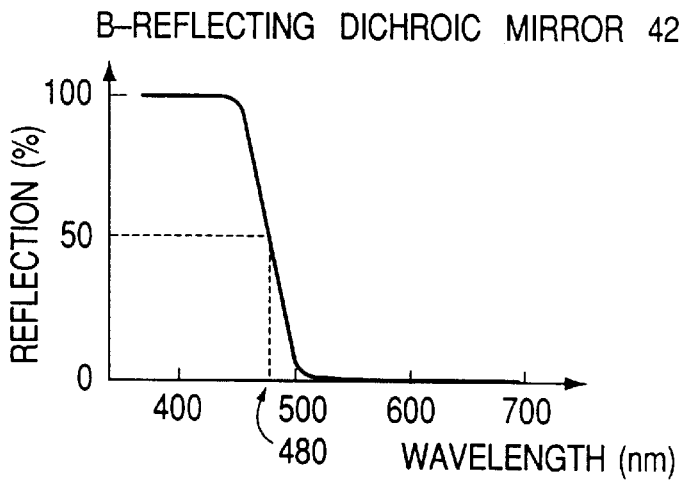
FIGS. 17A, 17B and 17C are graphs showing the spectral reflection characteristics of the dichroic mirrors that can be used in a projection type display apparatus according to the invention.
Figure 17B:
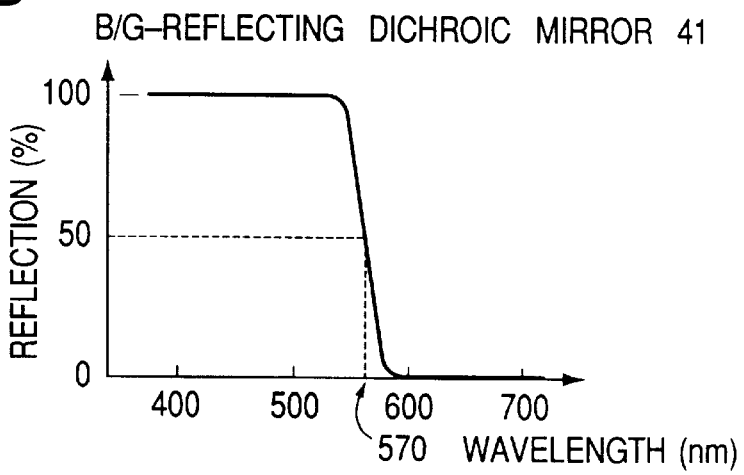
Figure 17C:
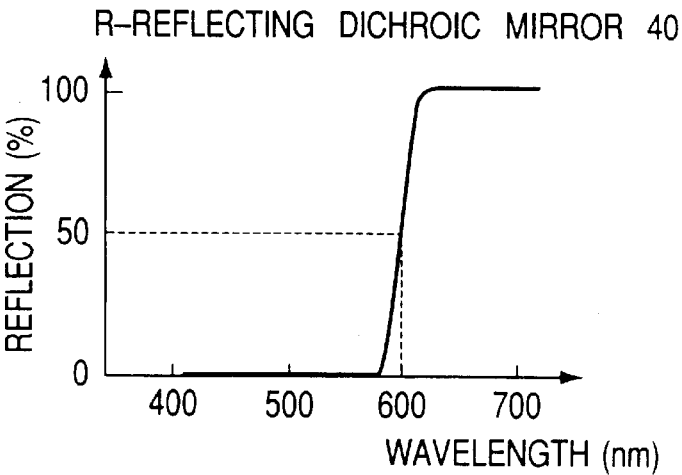
Figure 18:
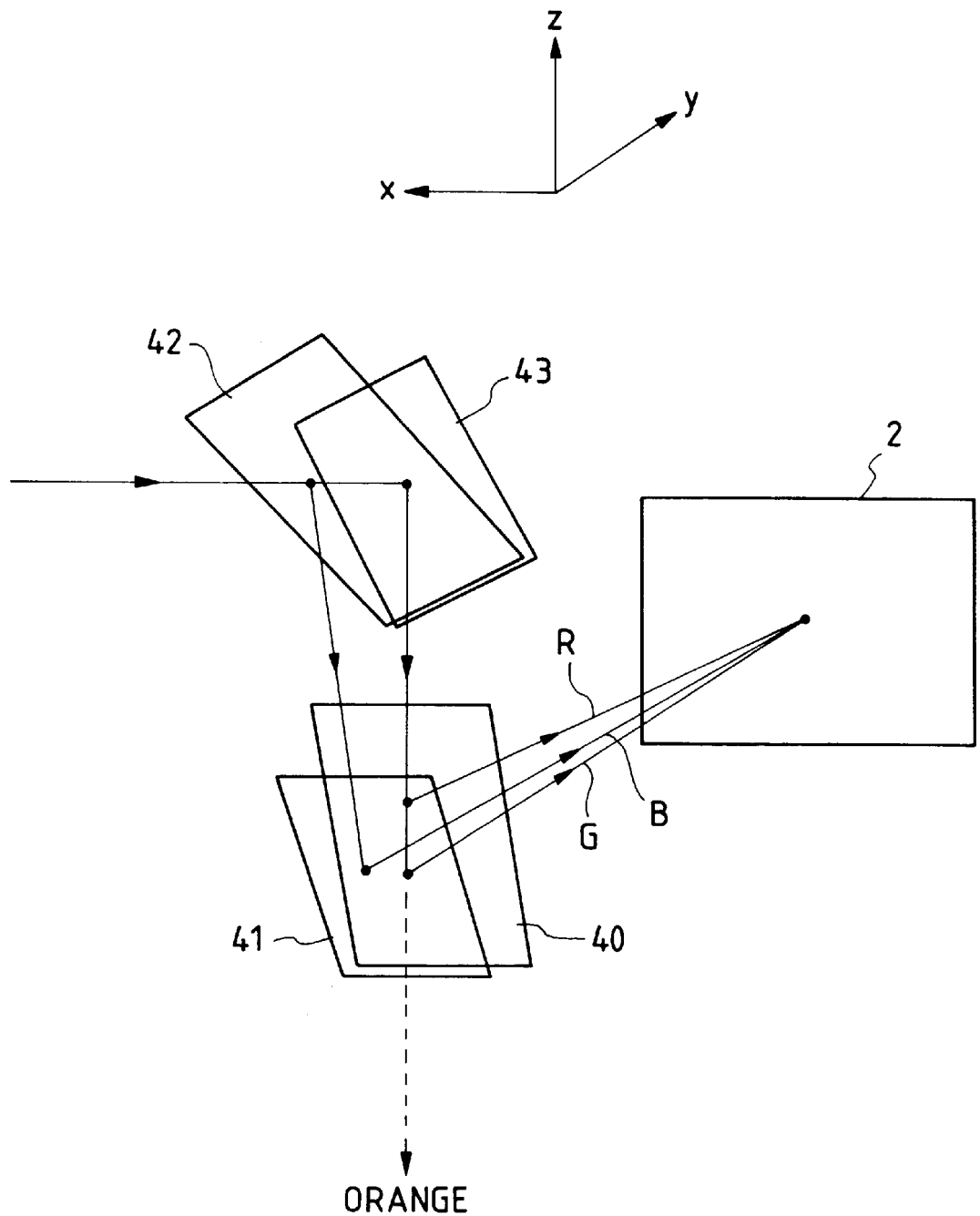
FIG. 18 is a schematic illustration of the color separation/illumination section of a projection type display apparatus according to the invention.

The R (red light) reflecting dichroic mirror 40, the B/G (blue and green light) reflecting dichroic mirror 41, and the B (blue light) reflecting dichroic mirror 42 have spectral reflection characteristics as illustrated in FIGS. 17A, 17B and 17C respectively. The dichroic mirrors are arranged three-dimensionally with the high reflection mirror 43 as shown in FIG. 18 in order to divide the white illumination light from the power source 8 into three primary colors of R, G and B and illluminate the liquid crystal panel 2 with rays of light of three primary colors three-dimensionally from different respective directions as will be described in greater detail hereinafter.

The flux of light from the light source 8 proceeds in a manner as described below. Firstly, the white flux of light emitted from the lamp 8 is focused to the entrance (incident light striking plane) 6a of the integrator 6 by the elliptic reflector 7 arranged upstream relative to it and then passes through the integrator 6, while being repeatedly reflected in the latter, to obtain a uniform spatial intensity distribution. The flux of light coming out of the exit 6b of the integrator 6 is then transformed into a parallel flux running along the x-axis (as shown in FIG. 16B) by means of the concave lens 51 and the Fresnel lens 50 before it gets to the B reflecting dichroic mirror 42.

Only rays of B light (blue light) are reflected downward by the B-reflecting dichroic mirror 42 and directed toward the R-reflecting dichroic mirror 40 with a predetermined angle relative to the z-axis (as shown in FIG. 16B). Meanwhile, the remaining rays of light of red and green (R/G light) pass through the B-reflecting dichroic mirror 42 and reflected rectangularly by the high reflection mirror 43 into the direction of the z-axis and also directed toward the R-reflecting dichroic mirror 40.

Thus, both the B-reflecting dichroic mirror 42 and the high reflection mirror 43 are so arranged as to reflect the flux of light coming from the integrator 6 (along the x-axis) downwardly along the z-axis in FIG. 16B and the high reflection mirror 43 is inclined by 45° from the x-y plane around the y-axis, whereas the B-reflecting dichroic mirror 42 is inclined by an angle smaller than 45° from the x-y plane around the y-axis.

As a result, while the R/G rays of light reflected by the high reflection mirror 43 is directed toward the R-reflecting dichroic mirror 40 exactly along the z-axis, the B rays of light reflected by the B-reflecting dichroic mirror 42 is directed downwardly toward the R-reflecting dichroic mirror 40 along a path tilted by a predetermined angle relative to the z-axis (a tilt in the x-z plane) in FIG. 16B. The positional shift and the angular tilt of the B-reflecting dichroic mirror 42 from the high reflection mirror 43 are so determined as to make the rays of light of the three colors intersect each other on the liquid crystal panel 2 in order to cause both B light and R/G light to cover a same and identical area on the liquid crystal panel 2.

Then, the rays of R/G/B light directed downward (in the direction of z-axis) in FIG. 16B move toward the R-reflecting dichroic mirror 40 and the B/G-reflecting dichroic mirror 41, which mirrors are located below the B-reflecting dichroic mirror 42 and the high reflection mirror 43. More specifically, the B/G-reflecting dichroic mirror 41 is inclined by 45° relative to the x-z plane around the x-axis, whereas the R-reflecting dichroic mirror 40 is inclined by an angle smaller than 450 relative to the x-z plane around the x-axis.

Thus, of the incident rays of R/G/B light, only those of B/G light are transmitted through the R-reflecting dichroic mirror 40 and reflected rectangularly by the B/G-reflecting dichroic mirror 41 into the positive direction of the y-axis before they are polarized by the PBS 3 to illuminate the liquid crystal panel 2 arranged horizontally on the x-z plane.

As described above (see FIGS. 16A and 16B), since the rays of B light proceed with a predetermined angle (the tilt in the x-z plane) relative to the x-axis, they also maintain a predetermined angle (the tilt in the x-z plane) relative to the y-axis after being reflected by the B/G-reflecting dichroic mirror 41 and illuminate the liquid crystal panel 2 with an angle of incidence (along the x-y plane) equal to that angle. On the other hand, the rays of G light is reflected rectangularly by the B/G-reflecting dichroic mirror 41 into the positive direction of the y-axis before they are polarized by the PBS 3 to illuminate the liquid crystal panel 2 perpendicularly with an angle of incidence equal to 0°.

Meanwhile, the rays of R light is reflected by the R-reflecting dichroic mirror 40 arranged upstream relative to the B/G-reflecting dichroic mirror 41 into the positive direction of the y-axis in a manner as described, showing a predetermined angle relative to the y-axis (the tilt in the y-z plane) as illustrated in FIG. 16C, before they are polarized by the PBS 3 to illuminate the liquid crystal panel 2 with an angle of incidence (along the y-z plane) equal to that angle.

As described above, the positional shift and the angular tilt of the B/G-reflecting dichroic mirror 41 from the R-reflecting dichroic mirror 40 are so determined as to make the rays of light of the three colors of R, G and B intersect each other on the liquid crystal panel 2 in order to cause both R light and B/G light to cover a same and identical area on the liquid crystal panel 2.

As shown in FIGS. 17A through 17C, the cut-off wavelength of the B/G-reflecting dichroic mirror 41 is 570 nm and that of the R-reflecting dichroic mirror 40 is 600 nm so that the rays of orange light are discarded out of the optical path after transmitting through the B/G-reflecting dichroic mirror 41 to provide an optimal balance of colors.

As will be described hereinafter, the rays of R, G and B light are reflection/polarization modulated by the liquid crystal panel 2 and reflected back to the PBS 3, which by turn reflects them into the positive direction of the x-axis by means of the PBS surface 3a and causes them to strike the projection lens 1. The projection lens 1 enlarges the image displayed on the liquid crystal panel 2 before it projects the image on the screen (not shown).

Since the rays of R, G and B light strike the liquid crystal panel 2 with respective angles of incidence that are different from each other, the reflected rays of R, G and B light also shows different angles. Therefore, the projection lens 1 is required to have a large diameter and a large aperture in order to take in all of them without missing any portion thereof. It should be noted that any angle of inclination of the flux of light striking the projection lens 1 is corrected as light of primary colors is collimated after passing through the micro lenses twice to maintain the angle of incidence at the liquid crystal panel 2.

Figures 28, 29:
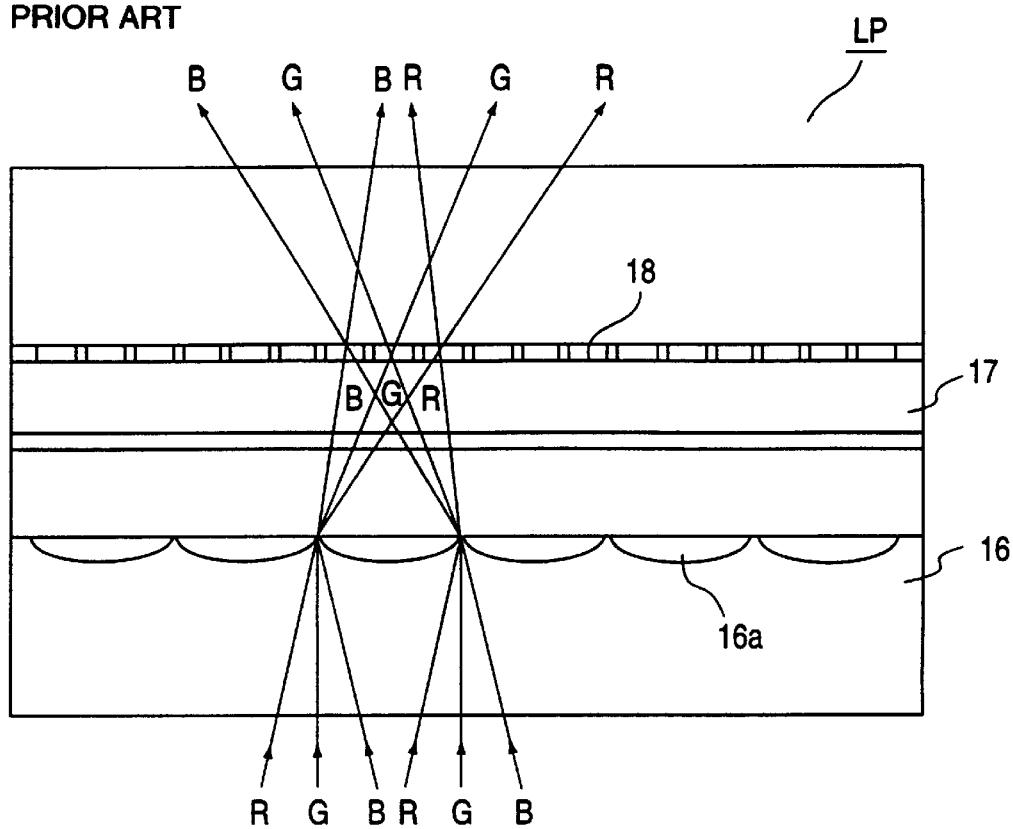
FIG. 28 is an enlarged schematic partial cross sectional side view of a known transmission type liquid crystal panel comprising micro lenses.
FIG. 29 is an enlarged schematic partial view of a projected image obtained by a known projection type display apparatus realized by using a transmission type liquid crystal panel comprising micro lenses.

On the other hand, with a known transmission type liquid crystal panel LP illustrated in FIG. 28, the flux of light leaving the liquid crystal panel LP is spread out partly due to the focusing effect of the micro lens array 16 so that the projection lens is required to have a large numerical aperture and hence a large diameter to accommodate the spread out flux of light.

In FIG. 28, reference numeral 16 denotes a micro lens array obtained by arranging a number of micro lenses 16a at a predetermined pitch and reference numerals 17 and 18 respectively denote a liquid crystal layer and pixels of the three primary colors of R (red), G (green) and B (blue).

Rays of light of R, G and B are made to illuminate the liquid crystal panel LP with respective angles of incidence that are different from each other so that rays of light of different colors are received respectively by the pixels 18 of the corresponding colors due to the focusing effect of the micro lenses 16a. This arrangement makes the use of color filters unnecessary and provides a display panel that exploits light highly efficiently. Thus, a projection type display apparatus provided with such a display panel can display clear and bright color images if it comprises a single liquid crystal panel.

However, a known projection type display apparatus comprising a display panel that is provided with a micro lens array as described above has a drawback that the pixels 18 of the three primary colors of R, G and B are enlarged and projected on the screen with the image being displayed there to make the mosaic arrangement of the R, G and B pixels clearly visible to the viewer to degrade the quality of the image displayed on the screen.

Contrary to this, the flux of light coming from the liquid crystal panel 2 of this embodiment shows only a relatively limited spread so that a clear and bright image can be projected onto the screen by means of a projection lens having a relatively small numerical aperture. Such a projection lens will naturally show small dimensions and the mosaic arrangement of R, G and B pixels can be made by far less visible.

Figure 19:
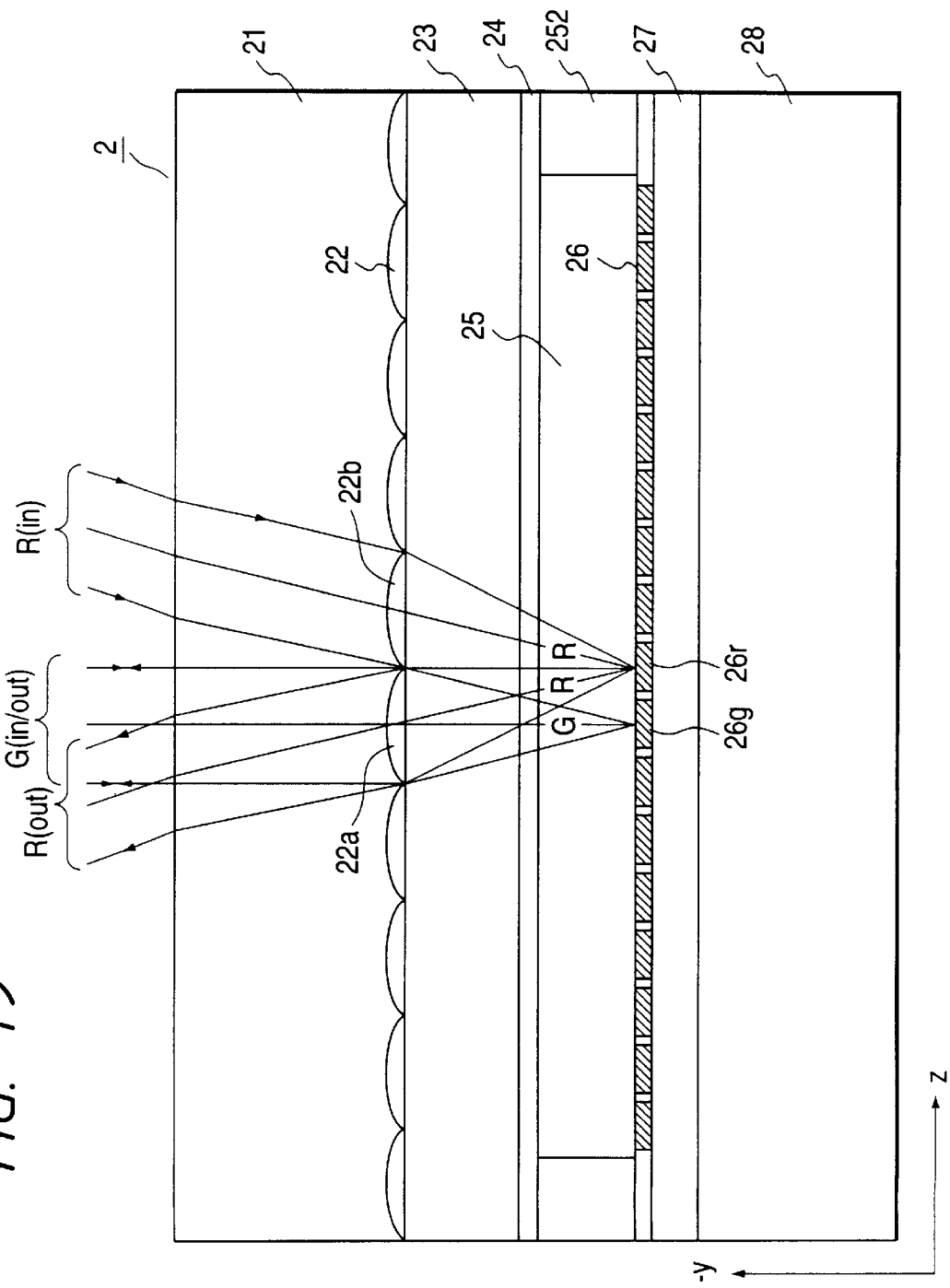
FIG. 19 is a schematic cross sectional view of a liquid crystal panel according to the invention.

Now, the liquid crystal panel 2 of this embodiment will be described further. FIG. 19 is an enlarged schematic sectional view of the liquid crystal panel 2 of this example.

Referring to FIG. 19, it comprises a micro lens substrate (glass substrate) 1, micro lenses 22, a sheet glass 23, a transparent opposite electrode 24, a liquid crystal layer 25, pixel electrodes 26, an active matrix drive circuit 27 and a silicon semiconductor substrate 28. The micro lenses 22 are formed on the surface of the glass substrate (alkali type glass) 21 by means of an ion exchange method at a pitch twice as large as that of the pixel electrodes 26 to show a two-dimensional array, which is referred to as micro lens array.

The liquid crystal layer 25 is formed by ECB mode nematic liquid crystal such as DAP or HAN that is adapted to a reflection type display panel and held to an oriented state by means of an orientation layer (not shown). The pixel electrodes 26 are made of Al (aluminum) and designed to operate also as so many reflectors as they are subjected to a CMP process after a patterning operation in order to improve the surface condition and their reflectivity.

The active matrix drive circuit 27 is arranged on the silicon substrate 28 and comprises both a horizontal driver circuit and a vertical driver circuit. It is designed to write video signals of the three primary colors of R, G and B respectively on the R, G and B pixel electrodes 26. While the pixel electrodes 26 do not comprise any color filters, they are discriminated as R, G and B pixels by the video signals of the primary colors written by the active matrix drive circuit 27 so that they form an R, G, B pixel array as will be described hereinafter.

Firstly, G light will be described as part of light illuminating the liquid crystal panel 2. As described earlier, principal rays of G light are polarized by the PBS 3 before they strike the liquid crystal panel 2 perpendicularly. Note that only a ray of G light striking a micro lens 22a is shown in FIG. 19 by arrow G (in/out).

As shown, rays of G light striking the micro lens 22a are focused by the lens 22a and illuminate G pixel electrode 26g made of Al, which reflects them and drives them to pass through the same micro lens 22a and go out of the liquid crystal panel 2. As the rays of G light reciprocatingly move through the liquid crystal layer 25, they are modulated by the action of the liquid crystal caused by the electric field that is formed between the G pixel electrode 26g and the opposite electrode 24 as a signal voltage is applied thereto before the rays return to the PBS 3. The quantity of light reflected by the PBS surface 3a and directed toward the projection lens 1 varies depending on the extent of modulation so that an image with different densities of light and different gradations will be displayed by the pixels.

Rays of R light falling aslant along the y-z plane are polarized by the PBS 3 before they strike the micro lens 22b as indicated by arrow R (in) in FIG. 19. Then, they are focused by the micro lens 22b and illuminate R pixel electrode 26r located slightly left relative to the position right below the lens 22b, which pixel electrode 26r reflects them and drives them to pass through a neighboring micro lens 22a and go out of the liquid crystal panel 2 (R (out)).

The (polarized) rays of R light are also modulated by the action of the liquid crystal caused by the electric field that is formed between the R pixel electrode 26r and the opposite pixel electrode 24 as a signal voltage is applied thereto before they move out of the liquid crystal panel 2 and return to the PBS 3. Thereafter, they are projected onto the display screen as part of the image to be displayed there in a manner as described above by referring to the rays of G light.

While the rays of G light striking the G pixel electrode 26g and those of R light striking the R pixel electrode 26r may seem to interfere with each other in FIG. 19, it is simply because the liquid crystal layer 25 is disproportionally enlarged there in terms of its thickness. In actual terms, the liquid crystal layer 25 has a thickness of 5 μm at most, which is very small relative to the sheet glass 23 having a thickness between 50 and 100 μm and hence such interference does not take place regardless of the size of each pixel.

Figure 20A:
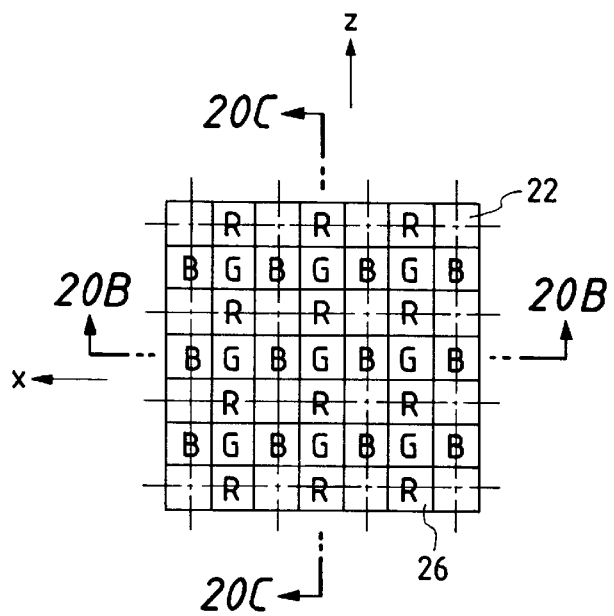
FIGS. 20A, 20B and 20C are illustrations showing the underlying principle of color separation and color synthesis for a liquid crystal panel according to the invention.
Figure 20C:
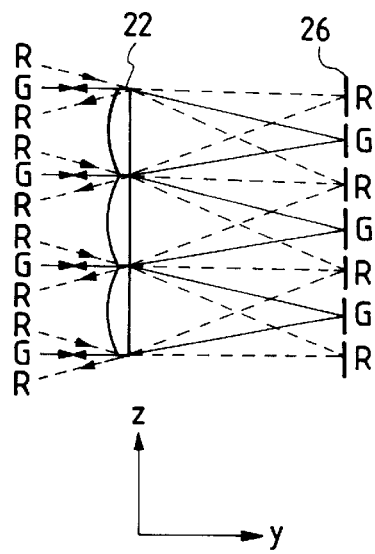
Figure 20B:
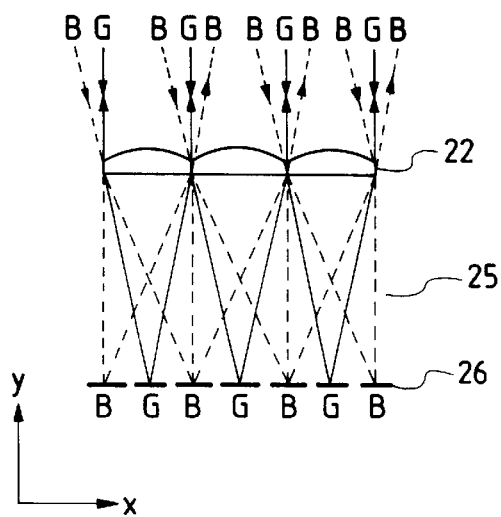

FIGS. 20A through 20C illustrate how color separation and color synthesis are carried out for the purpose of the invention. Note that FIG. 20A is a schematic plan view showing the upper surface of the liquid crystal panel 2 and FIGS. 20B and 20C are cross sectional views taken along line 20B—20B (the x-direction) and along line 20C—20C (z-direction) respectively.

It will be appreciated that FIG. 20C corresponds to FIG. 19 as they are taken along the y-z plane and show rays of G and R light entering and leaving the respective micro lenses 22. It will also be appreciated that the G pixel electrodes are located directly below the corresponding micro lenses 22 as primary pixel electrodes, whereas the R pixel electrodes are located directly below the respective boundaries of the micro lenses 22 as secondary pixel electrodes. Thus, the angle of incidence θ of R light is preferably so selected that tan θ is equal to the ratio of the pitch of pixel arrangement to the distance between the micro lens array 22 and the pixel electrode array 26.

On the other hand, FIG. 20B is a cross sectional view taken along the x-y plane of the liquid crystal panel. It will be seen that the B pixel electrodes that are ternary pixels are alternately arranged with the G pixel electrodes as in the case of FIG. 20C, wherein the G pixel electrodes are located directly below the corresponding micro lenses 22, whereas the B pixel electrodes are located directly below the respective boundaries of the micro lenses 22 as ternary pixels.

Since rays of B light illuminating the liquid crystal panel 2 strike the panel aslant (along the x-y plane) after they are polarized by the PBS 3 as described above, those coming from the micro lenses 22 are reflected by the respective B pixel electrodes and go out respectively from the adjacent micro lenses as viewed in the x-direction as shown in FIG. 20B. The mode of modulation of the liquid crystal layer 25 on the B pixel electrodes and the mode of projection of B light of the liquid crystal panel 2 are same as those described above in terms of G and R light.

The B pixel electrodes are located directly below the respective boundaries of the micro lenses 22 and, therefore, the angle of incidence θ of B light is preferably so selected that tan θ is equal to the ratio of the pitch of pixel arrangement (of the G and B pixels) to the distance between the micro lens array 22 and the pixel electrode array 26.

Thus, in the liquid crystal panel 2 of this example, the R, G and B pixels are arranged in the order of RGRGRG . . . along the z-direction (first direction) and in the order of BGBGBG . . . along the z-direction (second direction). FIG. 20A shows how they appear when viewed from above.

As described above, each of the pixels have a length equal to a half of that of each of the micro lenses 22 in either direction so that the pixels are arranged at a pitch equal to a half of the pitch of arrangement of the micro lenses 22 along the x- and z-directions. When viewed from above, it will be seen that the G pixels are located directly below the centers of the respective micro lenses 22, whereas the R pixels are located between the corresponding G pixels along the z-direction and directly below the respective boundaries of the micro lenses 22 and the B pixels are located between the corresponding G pixels along the x-direction and directly below the respective boundaries of the micro lenses 22. Each micro lens has a rectangular contour whose sides are twice as long as the corresponding sides of a pixel.

Figure 21:
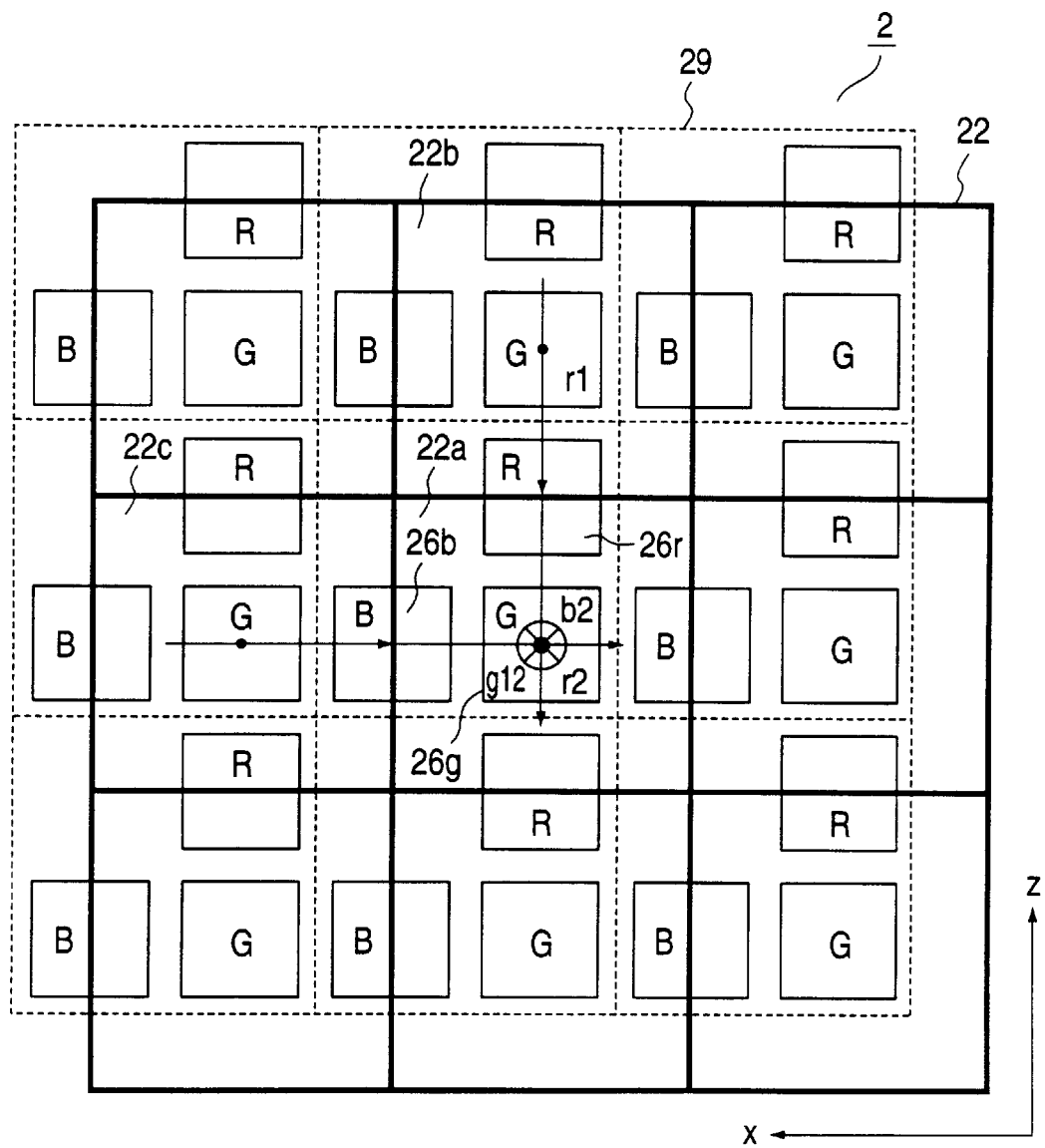
FIG. 21 is an enlarged schematic partial plan view of a liquid crystal panel according to the invention.

FIG. 21 is an enlarged schematic partial plan view of the liquid crystal panel 2. The lattice of broken lines in FIG. 21 define pixel units of R, G and B pixels for displaying images.

The pixel units are arranged two-dimensionally at a predetermined pitch on the substrate to produce a pixel unit array. In other words, when the R, G and B pixels are driven by the active matrix drive circuit 27 of FIG. 19, the R, G and B pixels of each pixel unit defined by the lattice of broken lines 29 are driven by respective R, G and B video signals that correspond to the location of the pixel unit.

Let us take a single pixel unit comprising a R pixel electrode 26r, a G pixel electrode 26g and a B pixel electrode 26b here. As indicated by arrow r1, the R pixel electrode 26r is illuminated by rays of R light coming aslant from the micro lens 22b, which rays of R light are then reflected to move out through the micro lens 22a as indicated by arrow r2. Similarly, the B pixel electrode 26b is illuminated by rays of B light coming aslant from the micro lens 22c as indicated by arrow b1, which rays of B light are then reflected to move out through the micro lens 22a as indicated by arrow b2.

On the other hand, the G pixel electrode 26g is illuminated by rays of G light coming perpendicularly from the micro lens 22a (relative to the FIG. 21) as indicated by arrow g12, which rays of G light are then reflected back to move out perpendicularly through the micro lens 22a.

Thus, with the liquid crystal panel 2 of this embodiment, while rays of light of the primary colors strike each of the pixel units respectively with different angles of incidence, they leave the pixel unit by way of a same micro lens (micro lens 22a in the above described example).

Figure 22:
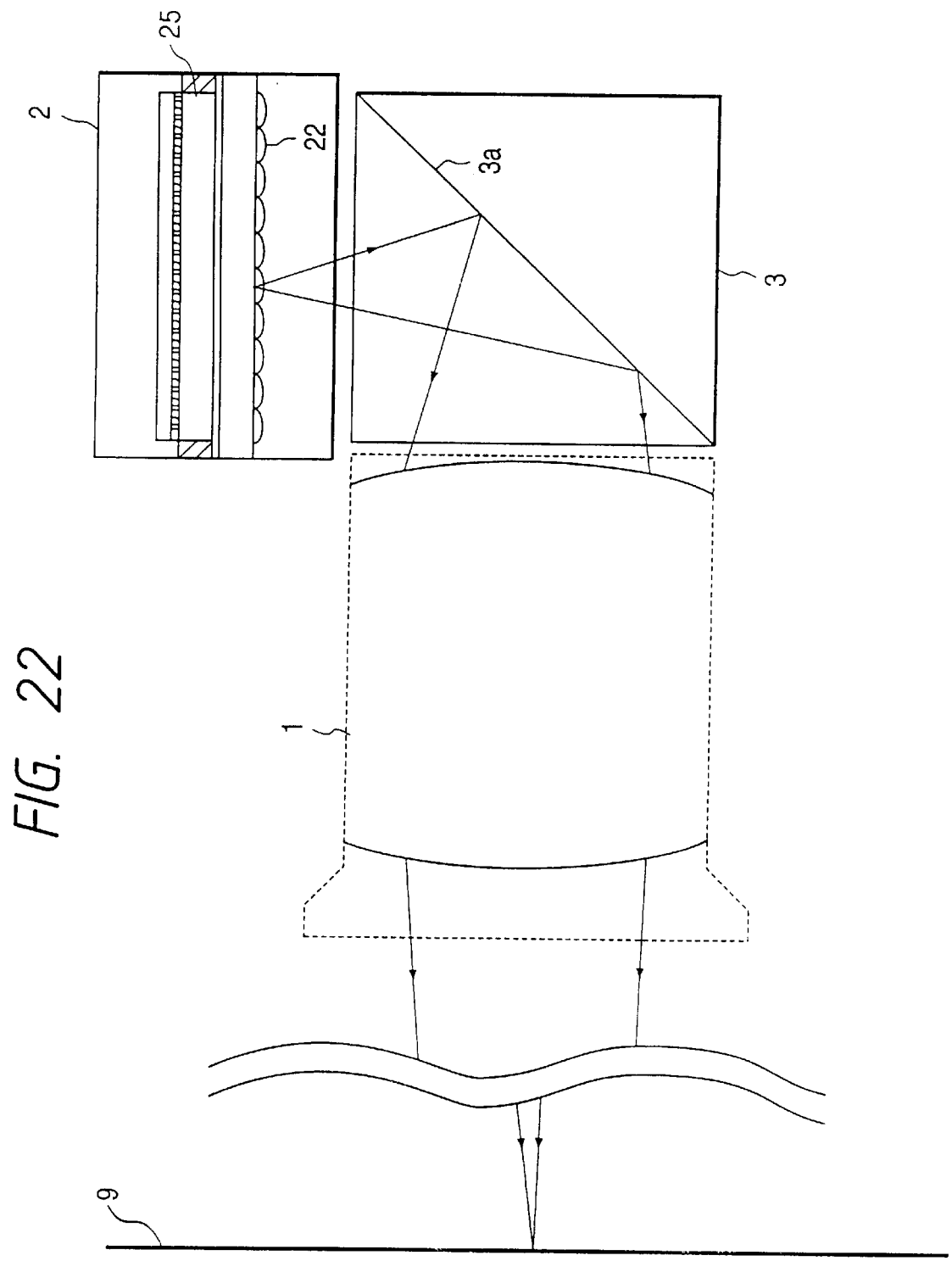
FIG. 22 is a schematic illustration of the projection optical system of a projection type display apparatus according to the invention.
Figure 24:
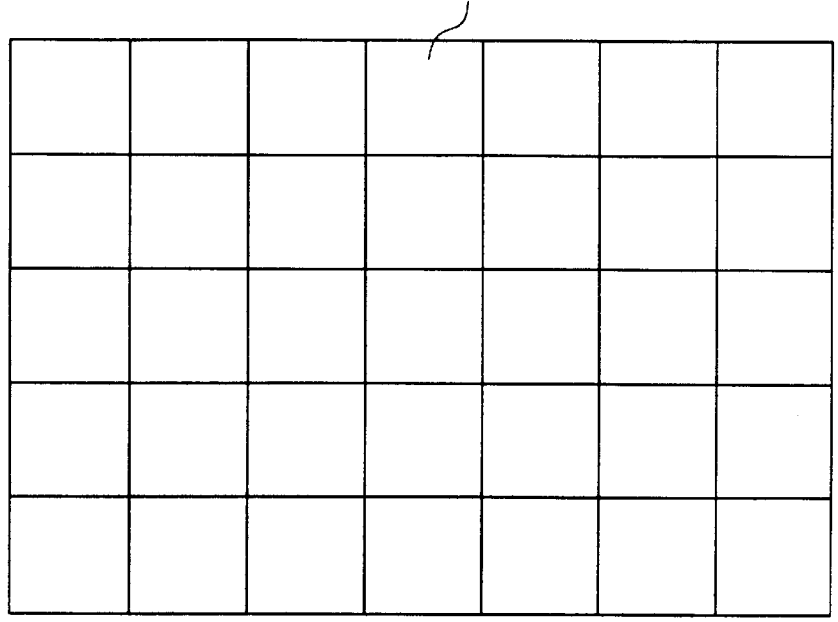
FIG. 24 is an enlarged schematic view of an image projected on the display screen of a projection type display apparatus according to the invention.

FIG. 22 is a schematic illustration showing how all the rays of light coming from the liquid crystal panel 2 are projected onto the screen 9 by way of the PBS 3 and the projection lens 1. A liquid crystal panel 2 as illustrated in FIG. 21 is used here. When the optical system is so regulated that an image of the micro lenses 22 and/or a neighboring area in the liquid crystal panel 2 are focused and projected on the display screen 9, the rays of light emitted from the R, G and B pixels of each pixel unit are mixed with each other on the corresponding area of the lattice of the micro lenses 22 to reproduce the original color as shown in FIG. 24.

In this example, a display panel as shown in FIG. 21 is used and the plane of the micro lenses 22 and/or a neighboring area provide a conjugated relationship with the display screen so that clear and bright color images may be displayed on the screen without showing the mosaic arrangement of R, G and B pixels.

Figure 23:
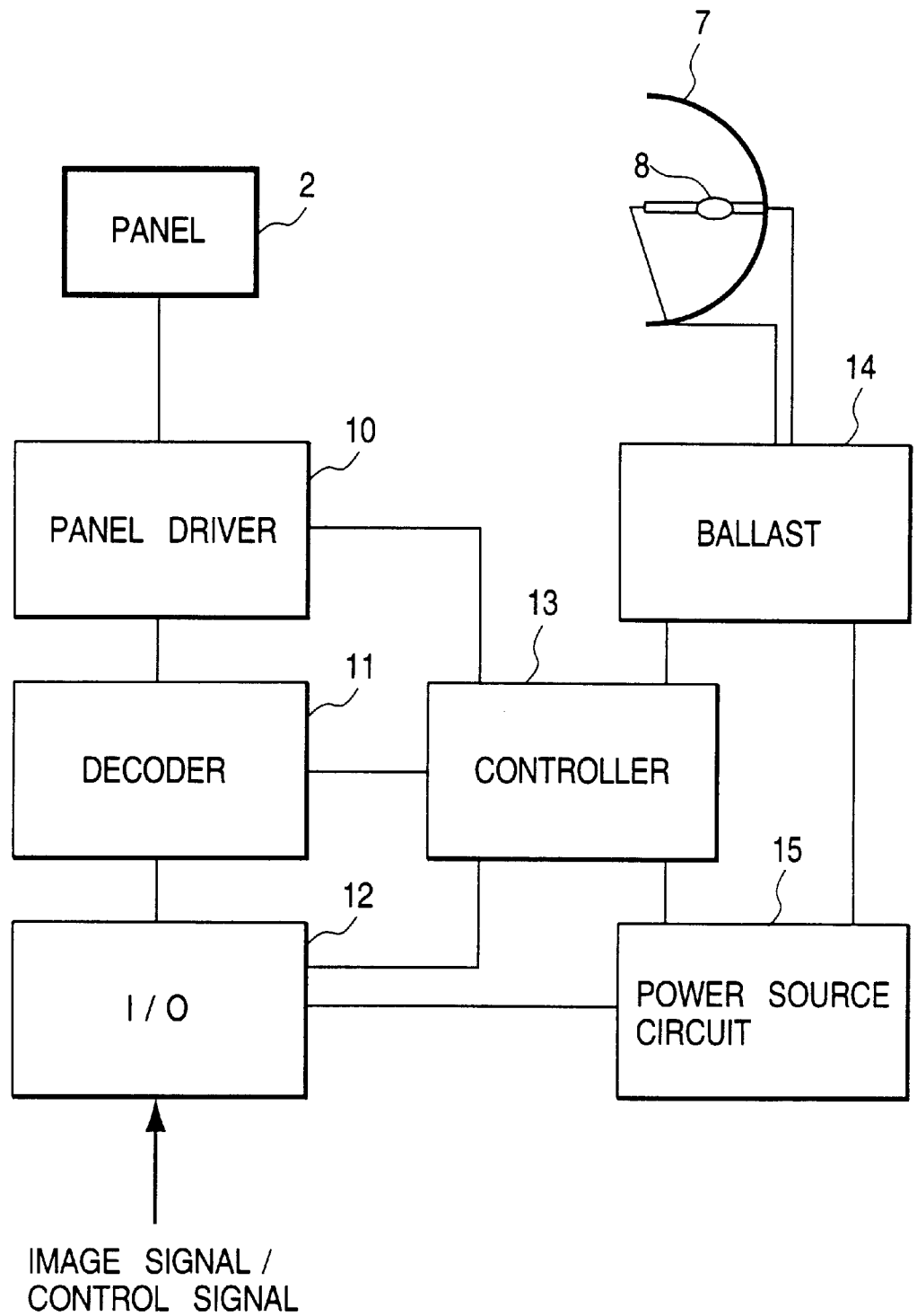
FIG. 23 is a schematic block diagram of the drive circuit system of a projection type display apparatus according to the invention.

FIG. 23 is a block diagram of the drive circuit system of the projection type liquid crystal display apparatus of this example.

Referring to FIG. 23, there are shown a panel driver 10 for producing R, G and B video signals along with drive signals for driving the opposite electrode 24 and various timing signals, an interface 12 for decoding video signals and control transmission signals into corresponding standard video signals and so on, a decoder 11 for decoding standard video signals from the interface 12 into primary color signals of R, G and B and synchronizing signals, a ballast 14 for driving an arc lamp 8 to emit light and a power supply circuit 15 for feeding the circuit blocks with power. Reference numeral 13 denotes a controller comprising an operating section (not shown) for controlling the operations of the circuit blocks.

A projection type liquid crystal display apparatus as described above can display clear and bright images without showing the mosaic arrangement of R, G and B pixels.

Figure 25:
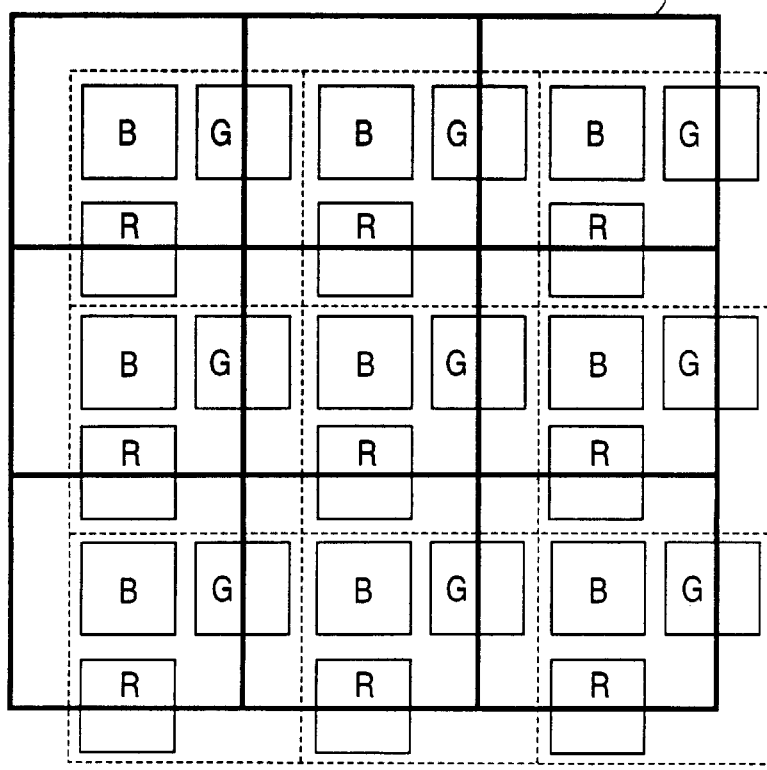
FIG. 25 is an enlarged schematic partial plan view of a liquid crystal panel according to the invention.

FIG. 25 is an enlarged schematic plan view of a modified embodiment of liquid crystal according to the invention. In this embodiment, B pixels are arranged directly below the centers of the respective micro lenses 22 as primary color pixels, whereas G pixels are arranged alternately with the B pixels along the lateral direction as secondary pixels and R pixels are arranged also alternately with the B pixels along the vertical direction as ternary pixels.

With such an arrangement again, rays of B light are made to perpendicularly strike a corresponding pixel unit while those of R/G light are made to strike aslant the pixel unit (in different directions with a same angle of incidence) so that the reflected rays of light leave the pixel unit through a same and common micro lens. Thus, the net result will be exactly same as the preceding embodiment. Alternatively, it may be so arranged that R pixels are arranged directly below the centers of the respective micro lenses 22 as primary pixels and the remaining pixels are arranged alternately and respectively along the lateral and vertical directions.

[Embodiment 5]

This embodiment is obtained by modifying the embodiment 4 described above.

Figure 26:
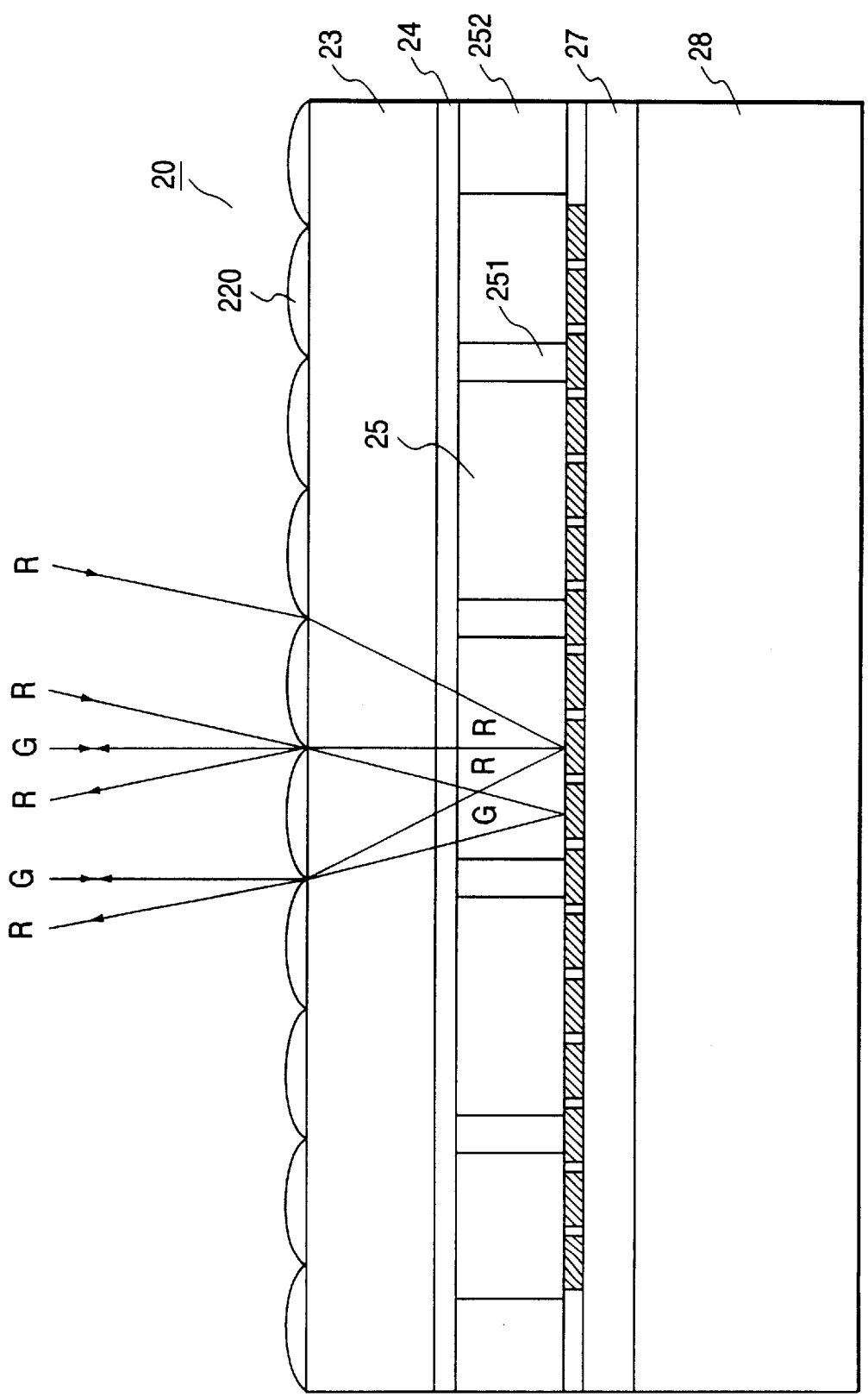
FIG. 26 is a schematic cross sectional view of a liquid crystal panel according to the invention.

FIG. 26 is an enlarged schematic cross sectional view of the liquid crystal panel 20 of this embodiment, showing a principal area thereof. This embodiment differs from Embodiment 4 in that a sheet glass 23 is used for the opposite glass substrate and micro lenses 220 are formed by laying thermoplastic resin on the sheet glass 23 by means of a so-called reflow technique. Additionally, column spacers 251 are arranged in non-pixel areas. The spacers are made of photosensitive resin and produced by photolithography.

Figure 27A:
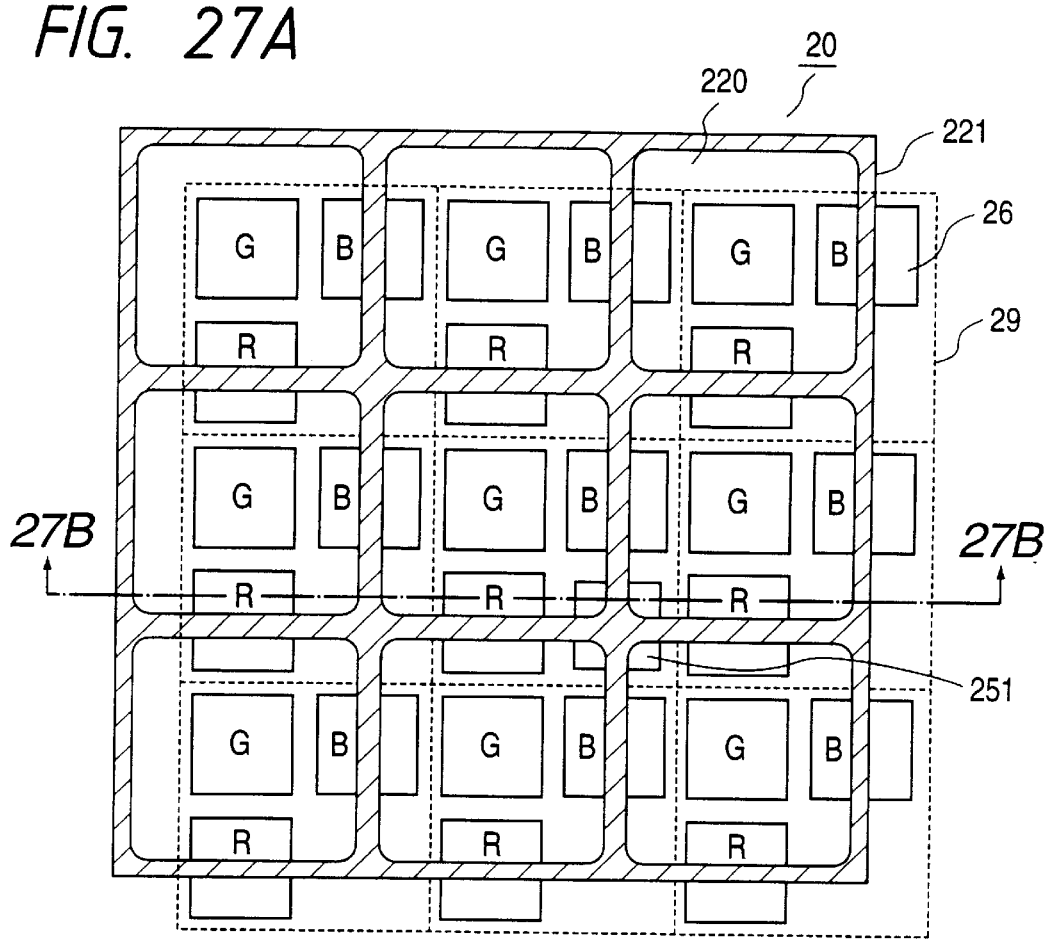
FIGS. 27A and 27B are an enlarged schematic partial plan view and an enlarged schematic cross sectional side view of a liquid crystal panel according to the invention.
Figure 27B:
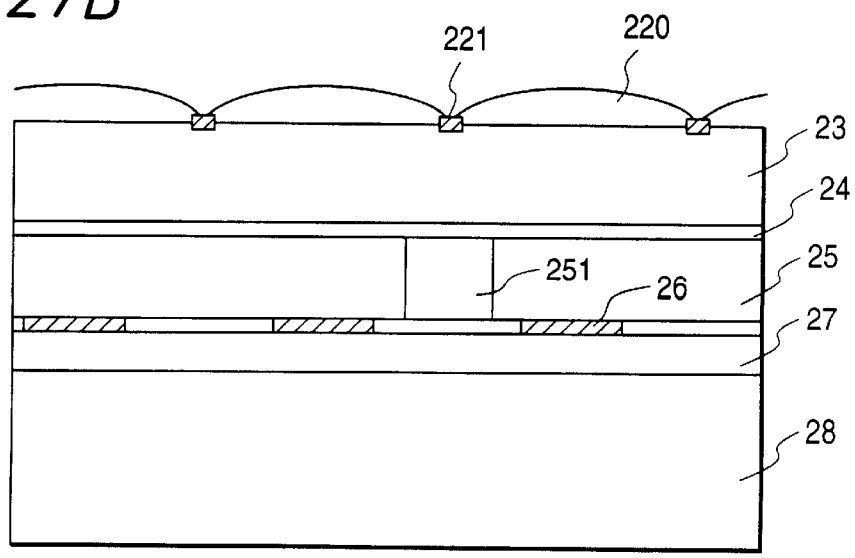

FIG. 27A is a schematic partial plan view of the liquid crystal panel 20. As shown, the column spacers 251 are arranged in non-pixel areas located at the corners of the micro lenses 220 at a predetermined pitch as a function of the pixel arrangement. FIG. 27B shows a cross sectional view taken along a line 27B—27B passing through a column spacer 251. Column spacers 251 are preferably arranged at a pitch corresponding to 10 to 100 pixels to show a matrix of spacers. The arrangement of column spacers has to meet the requirement of flatness of the sheet glass 23 and that of injectability of liquid crystal, which are contradictory to the provision of spacers.

This embodiment additionally comprises a light shielding layer 221 which is a patterned metal film for preventing any leak light from entering the inside through the boundary zones of the micro lenses. This arrangement can effectively prevent degraded color saturation and contrast of the projected image due to leak light. Thus, this embodiment comprising a liquid crystal panel according to the invention can display clearly defined high quality images.

As described above in detail by referring to Embodiments 1 through 5, the present invention provides the following advantages.

An enhanced degree of integration can be realized to downsize the liquid crystal display apparatus by making each pair of adjacently located pixel switch transistors of the apparatus share a common source region and a common source electrode or a common drain region and a common drain electrode.

A further enhanced degree of integration of MOS transistors can be achieved by arranging pixels having only NMOSs under the pixel electrode and those having only PMOSs under the pixel electrode without arranging pixel switches of CMOS configuration under each and every pixel electrode because the need of providing regions for isolating different wells that are required when MOSs with different polarities are arranged adjacently is eliminated. As a result, the pixels can be dimensionally reduced to provide a display apparatus adapted to high definition at low cost due to the reduced sizes of chips.

The parasitic capacitance of the signal lines can be reduced. The capacitance of a signal line mainly consists of that of the wiring layer and the junction capacitance between the source electrode and the well connected thereto and the latter is defined as a function of the surface area of the source region. Thus, the capacitance of the source region can be remarkably reduced by the present invention.

Since the capacitance of the signal lines is reduced, the time required for transferring signals from the video lines to the signal lines is reduced to by turn realize a high speed drive operation.

The sizes of chips can be reduced further along with the parasitic capacitance of the video lines because the transfer switches for transferring video signals from the video lines to the signal lines can be down-sized by the present invention. Thus, the power required for the driver for applying video signals to the display panel can be saved to realize a high speed drive system at reduced cost.

Only a single $n^+$ region of nMOS is required for a pair of transistors as shown in FIG. 3. With this arrangement, the parasitic capacitance of the signal lines can be greatly reduced. More specifically, the parasitic source capacitance of the signal lines can be reduced by half by causing each pair of transistors to share a common source. Additionally, the length of the display apparatus can be reduced along the signal lines when each source is shared by a pair of transistors to by turn shorten the signal lines and consequently reduce the capacitance and the resistance of the signal lines. Thus, the signal writing characteristics of the signal lines can be greatly improved to realize a finely gradated signal writing operation. Still additionally, the manufacturing yield and the manufacturing efficiency can be remarkably improved to consequently lower the manufacturing cost of a display panel according to the invention.

The sampling switches can be down-sized as a combined effect of the improved signal writing characteristics and the reduced capacitance and resistance of the signal lines so that the capacitance of the video signal lines (video lines) connected to the source electrodes of the sampling switches for analog signals is reduced to by turn reduce the load of the peripheral circuits and the power consumption rate. The net result will be a display panel that operates excellently at low cost. The above pointed out advantages will become more remarkable and effective when the display panel comprises a greater number of pixels to achieve a higher degree of resolution.

The above described arrangement is applicable not only to TFTs but also to nMOS transistors and/or pMOS transistors that are directly formed on the Si substrate. When TFTs are used, the pixels can be dimensionally reduced if compared with the case where CMOS transistors are used for pixel switches so that consequently the capacitance and the resistance of the signal lines can be significantly reduced to realize a highly performing liquid crystal panel adapted to highly gradated signal writing operations. However, it should be noted that, unlike the case where CMOS transistors are used, a supply voltage higher than the write voltage may be required because the pixel switches are affected by the substrate bias so that the liquid crystal display panel may be suited for low voltage drive.

As described above, according to the invention, each pair of adjacently located pixel switch transistors of the apparatus share a common source region to reduce the pixel size and realize a higher degree of integration.

Thus, the present invention realizes a liquid crystal display apparatus comprising down-sized chips to display finely defined images. Additionally, since the capacitance of the video lines is reduced, the drive power required for the external drive system is lessened to realize high speed operation and low manufacturing cost.

What is claimed is:

1. An active matrix substrate comprising:

a plurality of scanning lines and a plurality of signal lines intersecting said scanning lines;

a plurality of transistors arranged respectively at the crossings of said scanning lines and said signal lines and each having a source region connected to a corresponding signal line and a gate region connected to a corresponding scanning line, said plurality of transistors being CMOS and comprising nMOS and pMOS transistors arranged alternatingly in a direction along an extension of said signal lines; and pixel electrodes connected respectively to drain regions of said transistors, wherein:

each of pairs of mutually adjacent nMOS transistors and of mutually adjacent PMOS transistors share a common source region and the shared source region is connected to the corresponding signal line, and drain regions of each pair of mutually adjacent nMOS transistors and of pMOS transistors are connected to a single pixel electrode, only one type from among nMOS transistors and pMOS transistors being disposed under any one single pixel electrode.

2. An active matrix substrate according to claim 1, wherein said pixel electrodes are formed by polishing by means of a chemical/mechanical polishing technique.

3. An active matrix substrate according to claim 1, wherein a source electrode is shared by each pair of adjacently located transistors.

* * * * *

UNITED STATES PATENT AND TRADEMARK OFFICE
CERTIFICATE OF CORRECTION

PATENT NO. : 6,078,368
DATED : June 20, 2000
INVENTOR(S) : TAKESHI ICHIKAWA ET AL.

It is certified that error appears in the above-identified patent and that said Letters Patent is hereby corrected as shown below:

<u>ON COVER PAGE AT [54] TITLE</u>

"ACTIVE MATRIX SUBSTRATE, LIQUID CRYSTAL APPARATUS USING THE SAME AND DISPLAY APPARATUS USING SUCH LIQUID CRYSTAL APPARATUS"
     should read
--ACTIVE MATRIX SUBSTRATE HAVING PAIRS OF TRANSISTORS SHARING A SOURCE REGION IN COMMON--.

<u>ON COVER PAGE AT [56] REFERENCES CITED, FOREIGN PATENT DOCUMENTS</u>

"363311740  12/1988 Japan" should read --63-311740  12/1988 Japan--.

<u>COLUMN 1</u>

Lines 1-4, "ACTIVE MATRIX SUBSTRATE, LIQUID CRYSTAL APPARATUS USING THE SAME AND DISPLAY APPARATUS USING SUCH LIQUID CRYSTAL APPARATUS"
     should read
--ACTIVE MATRIX SUBSTRATE HAVING PAIRS OF TRANSISTORS SHARING A SOURCE REGION IN COMMON--.

<u>COLUMN 2</u>

Line 2, "above described" should read --above-described--;
Line 5, "above described" should read --above-described--;
Line 25, "above described" should read --above-described--.

UNITED STATES PATENT AND TRADEMARK OFFICE
CERTIFICATE OF CORRECTION

PATENT NO.   : 6,078,368
DATED        : June 20, 2000
INVENTOR(S)  : TAKESHI ICHIKAWA ET AL.

It is certified that error appears in the above-identified patent and that said Letters Patent is hereby corrected as shown below:

COLUMN 4

Line 14, "cross sectional" should read --cross-sectional--;
    Line 19, "cross sectional" should read --cross-sectional--;
    Line 23, "cross sectional" should read --cross-sectional--;
    Line 27, "cross sectional" should read --cross-sectional--;
    Line 63, "cross sectional" should read --cross-sectional--.

COLUMN 5

Line 15, "cross sectional" should read --cross-sectional--;
    Line 18, "cross sectional" should read --cross-sectional--;
    Line 20, "cross sectional" should read --cross-sectional--;
    Line 43, "cross sectional" should read --cross-sectional--.

COLUMN 6

Line 29, "cross sectional" should read --cross-sectional--.

COLUMN 7

Line 8, "cross sectional" should read --cross-sectional--;
    Line 20, "cross sectional" should read --cross-sectional--;
    Line 66, "above described" should read --above-described--.

COLUMN 8

Line 6, "the" should be deleted;
    Line 8, "zhe" should read --the--.

UNITED STATES PATENT AND TRADEMARK OFFICE
CERTIFICATE OF CORRECTION

PATENT NO. : 6,078,368

DATED : June 20, 2000

INVENTOR(S) : TAKESHI ICHIKAWA ET AL.

It is certified that error appears in the above-identified patent and that said Letters Patent is hereby corrected as shown below:

COLUMN 9

```
Line 23, "Firstly" should read --Firstly,--;
Line 44, "preferably" should read --preferably be--;
Line 50, close up right margin;
Line 51, close up left margin;
Line 59, close right margin;
Line 60, close up left margin.
```

COLUMN 10

```
Line 56, "cross sectional" should read --cross-sectional--.
```

COLUMN 12

```
Line 15, "he" should read --The--.
```

COLUMN 22

```
Line 18, "cross sectional" should read --cross-sectional--;
Line 33, "cross sectional" should read --cross-sectional--.
```

COLUMN 24

```
Line 30, "cross sectional" should read --cross-sectional--;
Line 43, "cross sectional" should read --cross-sectional--.
```

UNITED STATES PATENT AND TRADEMARK OFFICE
CERTIFICATE OF CORRECTION

PATENT NO.   :  6,078,368
DATED        :  June 20, 2000
INVENTOR(S)  :  TAKESHI ICHIKAWA ET AL.

It is certified that error appears in the above-identified patent and that said Letters Patent is hereby corrected as shown below:

<u>COLUMN 26</u>

Line 1, "above described" should read --above-described--;
Line 41, "PMOS" should read --pMOS--.

Signed and Sealed this

Twenty-second Day of May, 2001

NICHOLAS P. GODICI

Attest:

Attesting Officer

Acting Director of the United States Patent and Trademark Office